(12) United States Patent
Okuda et al.

(10) Patent No.: US 10,707,155 B2
(45) Date of Patent: Jul. 7, 2020

(54) SEMICONDUCTOR DEVICE WITH A BRIDGE INSULATION LAYER

(71) Applicant: ROHM CO., LTD., Kyoto-shi, Kyoto (JP)

(72) Inventors: Hajime Okuda, Kyoto (JP); Yoshinori Fukuda, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/156,845

(22) Filed: Oct. 10, 2018

(65) Prior Publication Data

US 2019/0115290 A1 Apr. 18, 2019

(30) Foreign Application Priority Data

Oct. 11, 2017 (JP) ................. 2017-198011

(51) Int. Cl.
*H01L 23/495* (2006.01)
*H01L 21/762* (2006.01)
*H01L 21/76* (2006.01)
*H01L 23/00* (2006.01)

(52) U.S. Cl.
CPC ........ *H01L 23/49558* (2013.01); *H01L 21/76* (2013.01); *H01L 21/76224* (2013.01); *H01L 23/4952* (2013.01); *H01L 23/49513* (2013.01); *H01L 23/49524* (2013.01); *H01L 23/49562* (2013.01); *H01L 23/562* (2013.01); *H01L 2224/0603* (2013.01); *H01L 2224/45014* (2013.01); *H01L 2224/48247* (2013.01); *H01L 2224/48464* (2013.01); *H01L 2224/4903* (2013.01); *H01L 2224/49171* (2013.01); *H01L 2924/181* (2013.01); *H01L 2924/19107* (2013.01)

(58) Field of Classification Search
None
See application file for complete search history.

(56) References Cited

U.S. PATENT DOCUMENTS

2013/0256783 A1* 10/2013 Katou ................. H01L 29/7827
257/328

FOREIGN PATENT DOCUMENTS

JP 2012209332 A 10/2012

* cited by examiner

*Primary Examiner* — Sonya D. McCall-Shepard
(74) *Attorney, Agent, or Firm* — Hamre, Schumann, Mueller & Larson, P.C.

(57) ABSTRACT

A semiconductor device includes a semiconductor layer that has a main surface including a defined region defined by a trench, a trench insulation layer formed in the trench, a field insulation layer that covers the defined region away from the trench, and a bridge insulation layer that is formed in a region between the trench and the field insulation layer in the defined region and that is connected to the trench insulation layer and to the field insulation layer.

17 Claims, 33 Drawing Sheets

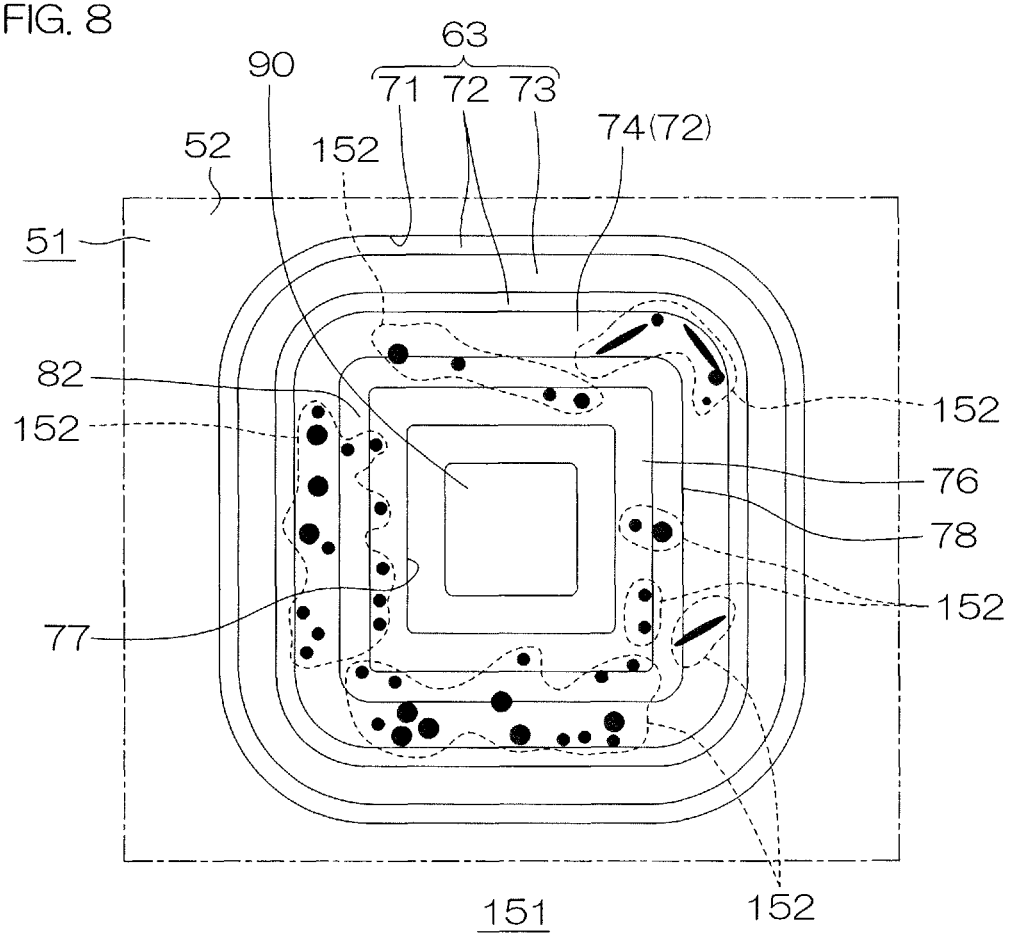

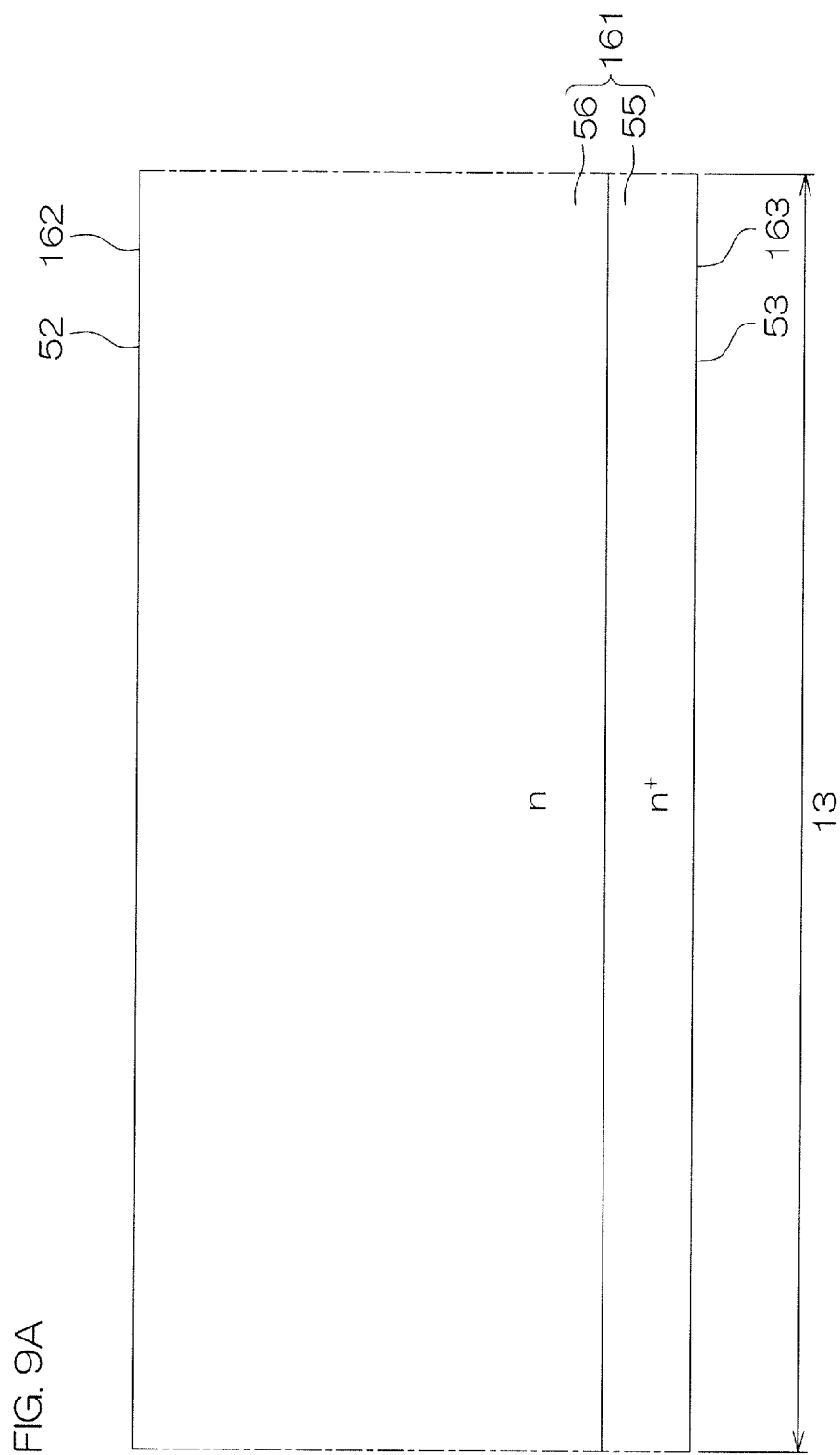

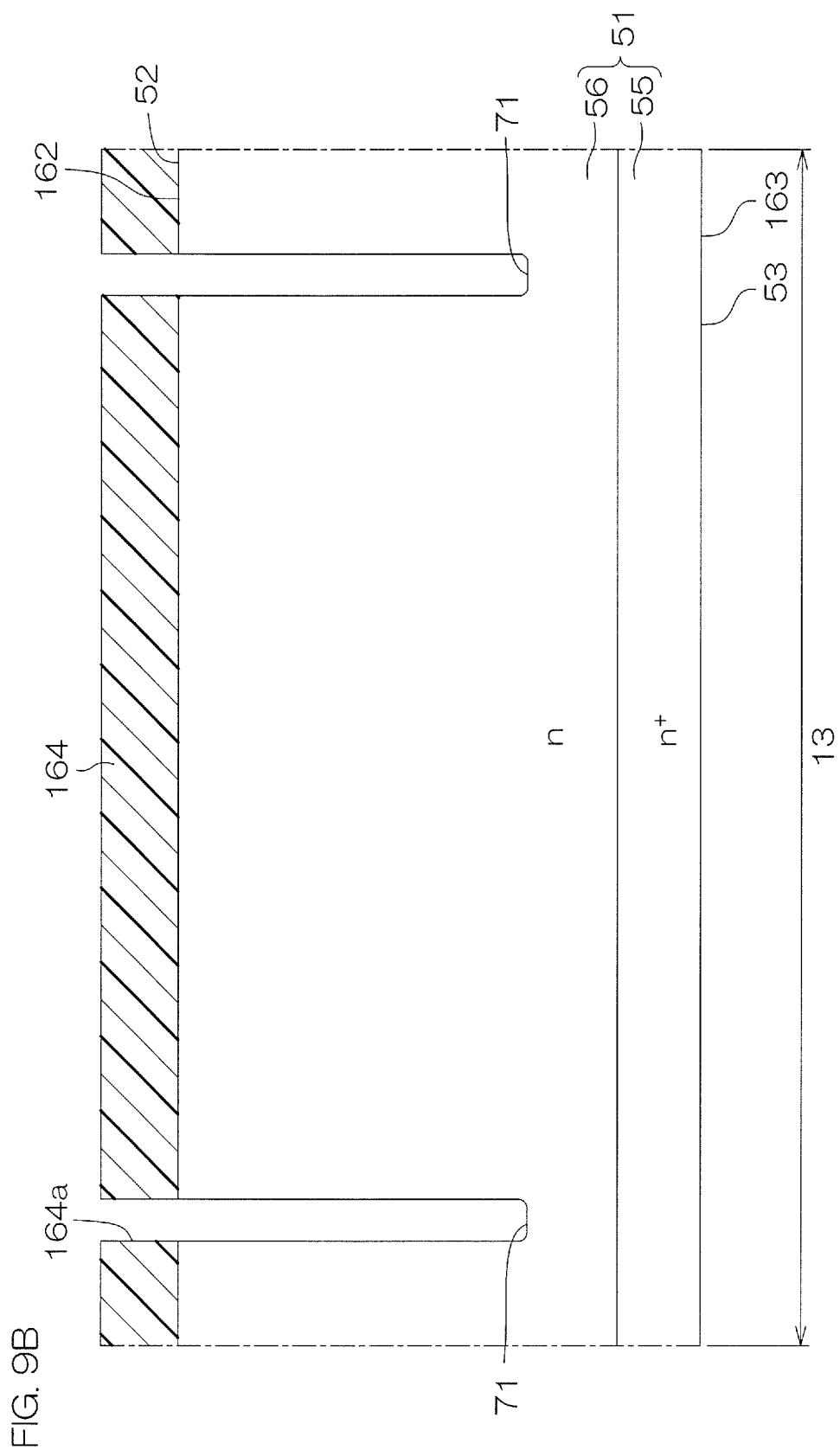

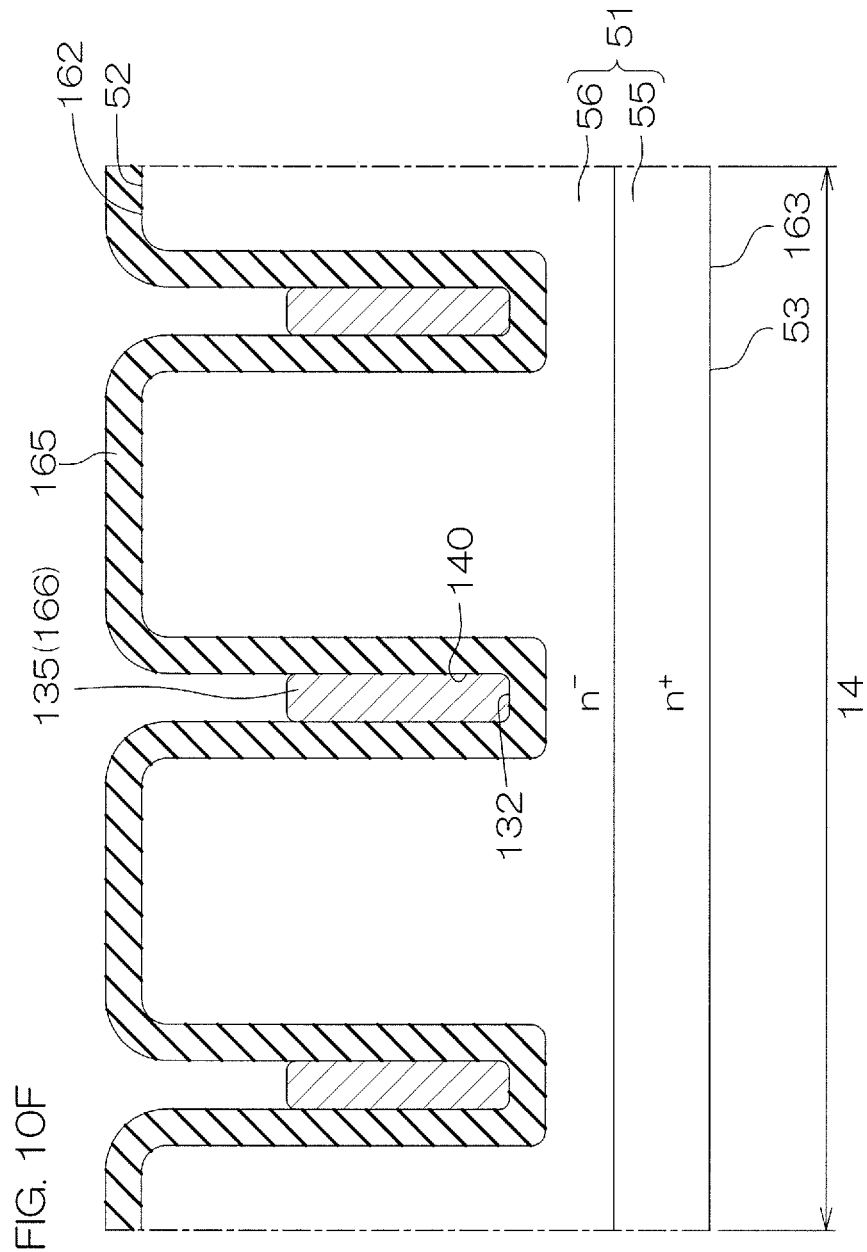

US 10,707,155 B2

SEMICONDUCTOR DEVICE WITH A BRIDGE INSULATION LAYER

CROSS REFERENCE TO RELATED APPLICATIONS

This application claims the benefit of priority to Japanese Patent Application No. 2017-198011 filed on Oct. 11, 2017. The entire contents of the application are hereby incorporated herein by reference.

BACKGROUND OF THE INVENTION

1. Field of the Invention

The present invention relates to a semiconductor device.

2. Description of the Related Art

JP2012-209332A discloses a semiconductor device that has a CMIS (Complementary Metal Insulator Semiconductor) structure. The CMIS structure includes an n-type MISFET (Metal Insulator Semiconductor Field Effect Transistor) and a p-type MISFET. The n-type MISFET and the p-type MISFET are insulated from each other by a trench insulation structure.

SUMMARY OF THE INVENTION

A preferred embodiment of the present invention provides a semiconductor device that includes a semiconductor layer that has a main surface including a defined region defined by a trench, a trench insulation layer formed in the trench, a field insulation layer with which the defined region is covered away from the trench, and a bridge insulation layer that is formed in a region between the trench and the field insulation layer in the defined region and that is connected to the trench insulation layer and to the field insulation layer.

The aforementioned or other objects, features, and effects of the present invention will be clarified by the following description of preferred embodiments given below with reference to the accompanying drawings.

BRIEF DESCRIPTION OF THE DRAWINGS

FIG. 8 is a plan view that shows a semiconductor device according to a reference example and that is to describe a mechanism by which a crystal defect is caused.

FIG. 10A to FIG. 10J are cross-sectional views to describe a method for manufacturing the semiconductor device of FIG. 1.

DETAILED DESCRIPTION OF THE PREFERRED EMBODIMENTS

Various regions are defined by a trench insulation structure in a semiconductor layer. In the semiconductor device of JP2012-209332A, an active region having the CMIS structure is defined by the trench insulation structure.

Here, consideration is given to a case in which an island-shaped insulation layer with which the region defined by the trench insulation structure is covered is formed in the region. The island-shaped insulation layer is independently formed in a state of being separated from the trench insulation structure.

An influence by the expansion and contraction of the trench insulation structure resulting from thermal expansion or the like and an influence by the expansion and contraction of the island-shaped insulation layer resulting from thermal expansion or the like are given to the semiconductor layer independently of each other. As a result, a relative positional relationship between the trench insulation structure and the island-shaped insulation layer varies, and therefore stress occurs in the semiconductor layer. Stress on the semiconductor layer causes a crystal defect or the like.

A preferred embodiment of the present invention provides a semiconductor device capable of restraining the crystal defect of the semiconductor layer.

A preferred embodiment of the present invention provides a semiconductor device that includes a semiconductor layer that has a main surface including a defined region that is defined by a trench, a trench insulation layer formed in the trench, a field insulation layer that covers the defined region away from the trench, and a bridge insulation layer that is formed in a region between the trench and the field insulation layer in the defined region and that is connected to the trench insulation layer and to the field insulation layer.

According to this semiconductor device, the trench insulation layer and the field insulation layer are connected together by the bridge insulation layer. This bridge insulation layer makes it possible to keep the region between the trench insulation layer and the field insulation layer at a predetermined interval. This makes it possible to restrain a variation in the relative positional relationship between the trench insulation layer and the field insulation layer that results from thermal expansion or the like. As a result, it is possible to restrain stress on the semiconductor layer, and therefore it is possible to provide a semiconductor device capable of restraining a crystal defect of the semiconductor layer.

A preferred embodiment of the present invention will be hereinafter described in detail with reference to the accompanying drawings.

Figure 1:
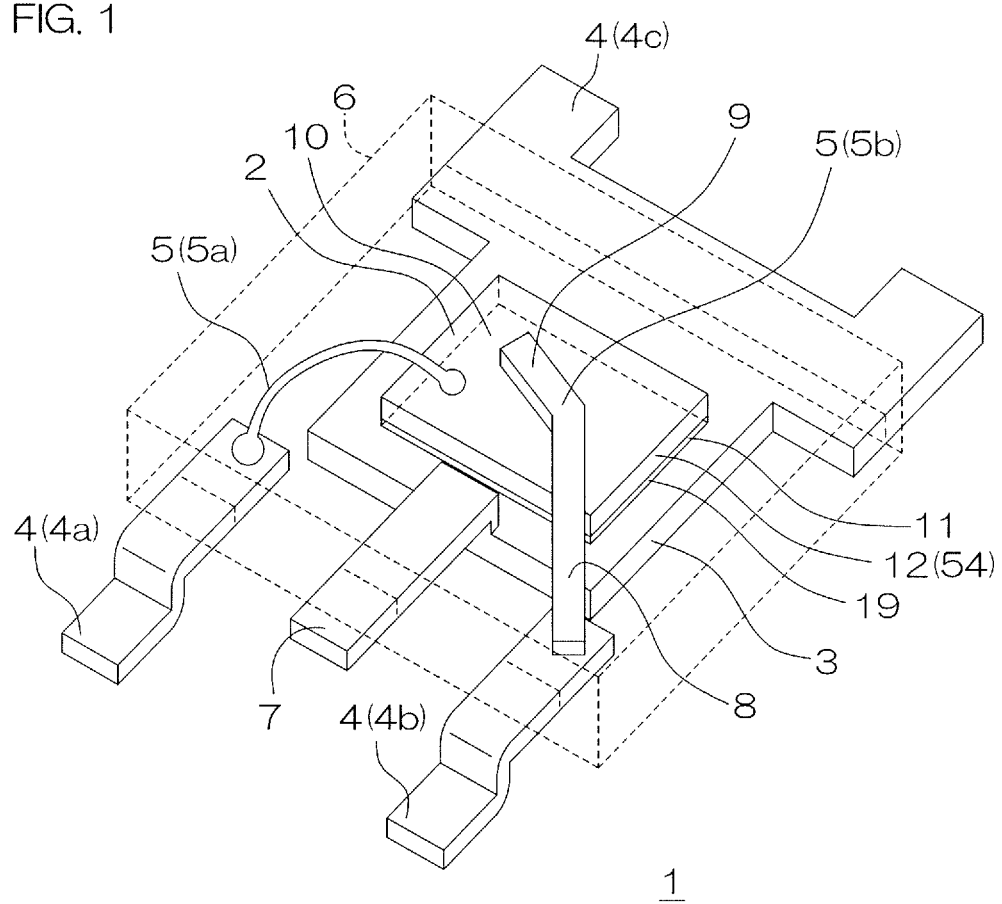
FIG. 1 is a perspective view that shows a semiconductor device according to a first preferred embodiment of the present invention, seen through a semiconductor package.
Figure 2:
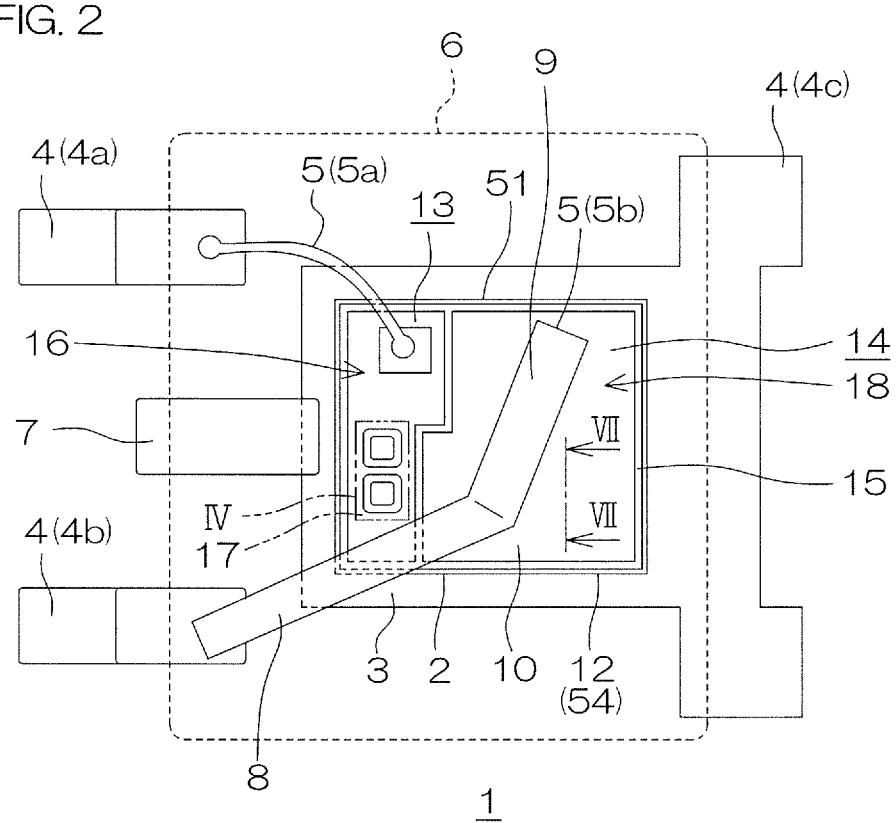
FIG. 2 is a plan view showing an internal structure of the semiconductor device of FIG. 1.

FIG. 1 is a perspective view that shows a semiconductor device 1 according to a first preferred embodiment of the present invention, seen through a semiconductor package 6. FIG. 2 is a plan view showing an internal structure of the semiconductor device 1 of FIG. 1.

With reference to FIG. 1 and FIG. 2, the semiconductor device 1 is an electronic component in which a TO (Transistor Outline)-based package, which is typified by TO-220 or TO-252, is employed as a package type in the present preferred embodiment. In the present preferred embodiment, TO-252 is employed. The semiconductor device 1 includes an IPD (Intelligent Power Device) chip 2, a die pad 3, a plurality of lead terminals 4, a plurality of lead wires 5, and the semiconductor package 6.

The IPD chip 2 is formed in a rectangular parallelepiped shape. The IPD chip 2 has a first chip main surface 10 on one side, a second chip main surface 11 on the other side, and a chip side surface 12 by which the first chip main surface 10 and the second chip main surface 11 are connected together. The first chip main surface 10 and the second chip main surface 11 are electrode planes on each of which an electrode is formed. The IPD chip 2 is a semiconductor chip that has a vertical structure.

The IPD chip 2 includes an input region 13 and an output region 14. The input region 13 and the output region 14 are defined by a device isolation structure 15. Although a detailed description is omitted, the device isolation structure 15 may have a trench insulation structure in which an insulator is embedded in a trench.

The input region 13 includes a control IC 16. The input region 13 includes a CMIS region 17 in which a CMIS (Complementary Metal Insulator Semiconductor) is formed. A detailed structure of the CMIS region 17 is described later.

The output region 14 includes an output power MISFET (Metal Insulator Semiconductor Field Effect Transistor) 18 that is an example of an insulated-gate type field-effect transistor. The output power MISFET 18 is controlled by the control IC 16.

The area S1 of the output region 14 is equal to or more than the area S2 of the input region 13 (S2≤S1) in a plan view seen from the normal direction of the first chip main surface 10. The ratio S1/S2 of the area S1 to the area S2 may be greater than 1 and be equal to or less than 10 (1<S1/S2≤10). The planar shape of the input region 13 and the planar shape of the output region 14 are arbitrary, and are not limited to specific shapes.

The die pad 3 is formed in a rectangular parallelepiped shape. The die pad 3 supports the IPD chip 2 from the second-chip-main surface-11 side. The die pad 3 is connected to the IPD chip 2 through an conductive bonding material 19. The conductive bonding material 19 may be a metallic paste or a solder.

The plurality of lead terminals 4 function as external terminals that are connected to the outside, respectively. The plurality of lead terminals 4 are disposed around the die pad 3. In the present preferred embodiment, the plurality of lead terminals 4 include a first lead terminal 4a, a second lead terminal 4b, and a third lead terminal 4c.

The first lead terminal 4a and the second lead terminal 4b are arranged along a side of the die pad 3. The first lead terminal 4a and the second lead terminal 4b are both disposed away from the die pad 3. The first lead terminal 4a and the second lead terminal 4b extend in a belt shape along a direction perpendicular to an array direction.

The third lead terminal 4c is formed integrally with the die pad 3. The third lead terminal 4c is rectangularly drawn out from an opposite side that is opposed to the side on which the first lead terminal 4a and the second lead terminal 4b are disposed in the die pad 3. A cutout concave portion that is hollow toward the die pad 3 is formed at a central part of the third lead terminal 4c in a plan view seen from the normal direction of the first chip main surface 10.

The first lead terminal 4a and the second lead terminal 4b are electrically connected to arbitrary regions of the IPD chip 2 through lead wires 5, respectively. The lead wire 5 may include a bonding wire. The lead wire 5 may include aluminum.

In more detail, the lead wire 5 includes a first lead wire 5a and a second lead wire 5b. The first lead wire 5a electrically connects the first lead terminal 4a to the input region 13. The second lead wire 5b electrically connects the second lead terminal 4b to the output region 14.

The second lead wire 5b connected to the output region 14 is thicker than the first lead wire 5a connected to the input region 13. The connection area of the second lead wire 5b with respect to the output region 14 is larger than the connection area of the first lead wire 5a with respect to the input region 13.

The second lead wire 5b includes a bridge portion 8 and a connection portion 9 in the present preferred embodiment. The bridge portion 8 is constructed in a region between the second lead terminal 4b and the output region 14. The bridge portion 8 includes an end placed on the second lead terminal 4b and an opposite end placed on the output region 14.

The connection portion 9 is drawn out from the opposite end of the bridge portion 8 to a region on the output region 14 so as to be connected to the output region 14. The connection portion 9 extends along the output region 14 in a plan view seen from the normal direction of the first chip main surface 10.

The connection portion 9 extends along a direction tilted exactly at a predetermined angle with a direction in which the bridge portion 8 extends. If the direction in which the bridge portion 8 extends substantially coincides with a direction in which the output region 14 extends, the direction in which the connection portion 9 extends may substantially coincide with the direction in which the bridge portion 8 extends.

It is possible to secure the connection area of the connection portion 9 with respect to the output region 14 without being seized with the direction in which the bridge portion 8 extends by designing the second lead wire 5b in such a way as to make a separation into the bridge portion 8 and the connection portion 9. The second lead wire 5b appropriately dissipates heat generated in the output region 14 outwardly.

A frame portion 7 is disposed in a region between the first lead terminal 4a and the second lead terminal 4b. The frame portion 7 is drawn out from the die pad 3. The frame portion 7 extends along a direction perpendicular to the array direction of both the first lead terminal 4a and the second lead terminal 4b. The frame portion 7 is apart of a lead frame supporting the die pad 3 that has remained in a manufacturing process.

The semiconductor package 6 is formed in a rectangular parallelepiped shape. The semiconductor package 6 includes a sealing resin. The sealing resin may be an epoxy resin. The semiconductor package 6 seals the IPD chip 2, the die pad 3, the plurality of lead terminals 4, and the frame portion 7.

A rear surface of the die pad 3 is exposed from the semiconductor package 6. The rear surface of the die pad 3 is a surface opposite to a surface that supports the IPD chip 2. The plurality of lead terminals 4 is drawn outwardly from the inside of the semiconductor package 6. The frame portion 7 is drawn outwardly from the inside of the semiconductor package 6.

Figure 3:
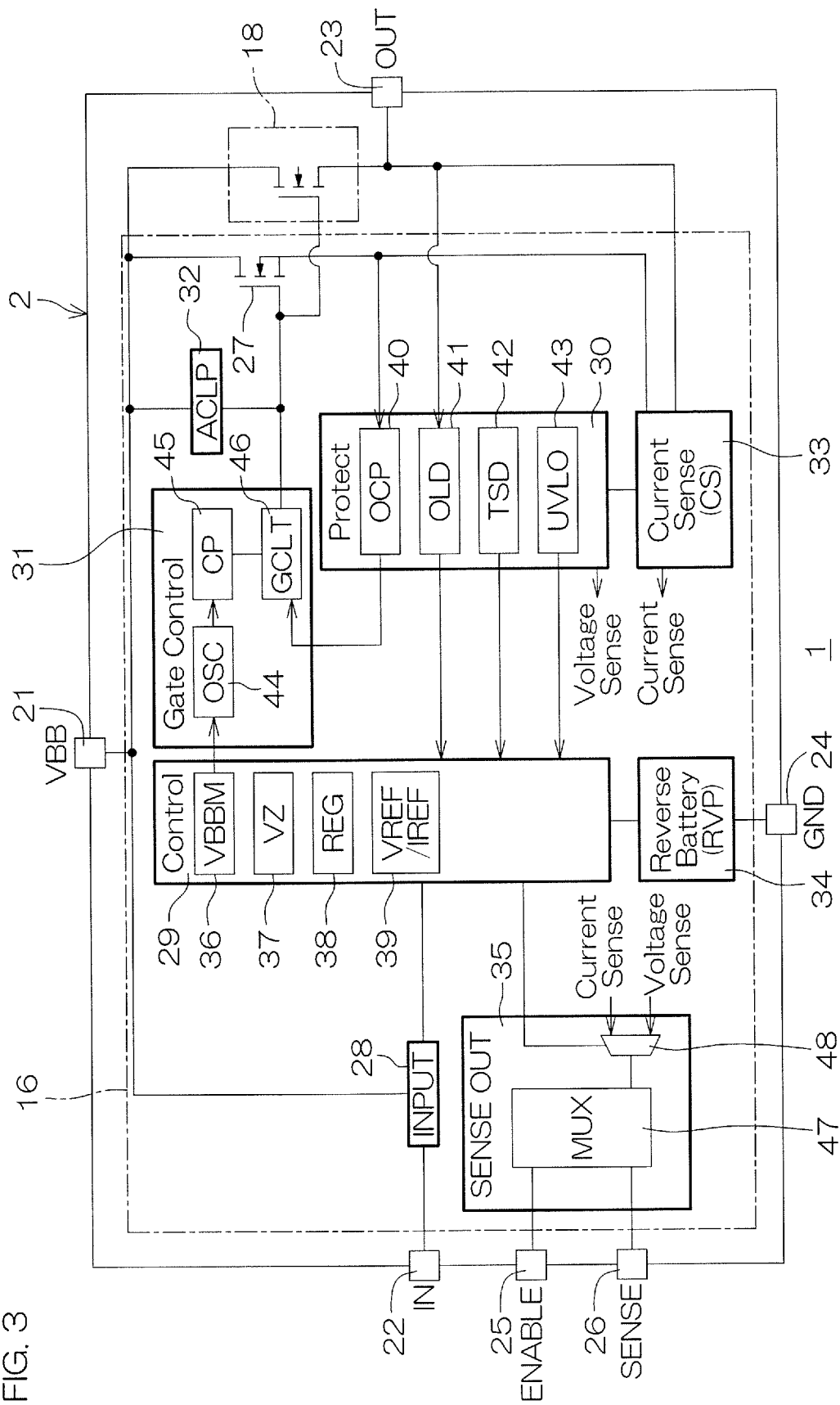
FIG. 3 is a block circuit diagram showing an electric structure of an IPD chip shown in FIG. 1.

FIG. 3 is a block circuit diagram showing an electric structure of the IPD chip 2 shown in FIG. 1. As an example, a description will be hereinafter given of a case in which the semiconductor device 1 is mounted on a vehicle.

With reference to FIG. 3, the IPD chip 2 includes a power supply terminal 21, an input terminal 22, an output terminal 23, a ground terminal 24, an ENABLE terminal 25, and a SENSE terminal 26. The power supply terminal 21 may be connected to a battery. A power-supply voltage of about 12 V to 14 V may be applied to the power supply terminal 21. The power supply terminal 21 provides the power-supply voltage to various circuit portions disposed in the IPD chip 2.

The input terminal 22 may be connected to an MCU (Micro Controller Unit), a DC/DC converter, an LDO (Low Drop Out), etc. An input voltage of 5 V may be applied to the input terminal 22. The output terminal 23 is connected to a load. The ground terminal 24 provides a ground potential to various circuit portions disposed in the IPD chip 2.

The ENABLE terminal 25 may be connected to the MCU. A control signal that controls the driving and the stopping of the IPD chip 2 may be input into the ENABLE terminal 25. The SENSE terminal 26 may be connected to a resistor.

The control IC 16 of the IPD chip 2 includes a sensor MISFET 27, an input circuit portion 28, a voltage-controlled circuit portion 29, a protection circuit portion 30, a gate drive control circuit portion 31, an active clamp circuit portion 32, a current detection circuit portion 33, a battery-reverse-connection protection circuit portion 34, and a malfunction detection circuit portion 35.

The output power MISFET 18 of the IPD chip 2 includes a gate, a drain, and a source. The gate of the output power MISFET 18 is connected to the control IC 16 (more specifically, to the gate drive control circuit portion 31 described later).

The drain of the output power MISFET 18 is connected to the power supply terminal 21. The source of the output power MISFET 18 is connected to the control IC 16 (more specifically, to the current detection circuit portion 33 described later) and to the output terminal 23.

The sensor MISFET 27 includes a gate, a drain, and a source. The gate of the sensor MISFET 27 is connected to the gate drive control circuit portion 31. The drain of the sensor MISFET 27 is connected to the power supply terminal 21. The source of the sensor MISFET 27 is connected to the current detection circuit portion 33.

The input circuit portion 28 is connected to the input terminal 22 and to the voltage-controlled circuit portion 29. The input circuit portion 28 may include a Schmidt trigger circuit. The input circuit portion 28 shapes the waveform of a voltage signal applied to the input terminal 22. A signal generated by the input circuit portion 28 is input into the voltage-controlled circuit portion 29.

The voltage-controlled circuit portion 29 is connected to the gate drive control circuit portion 31, to the protection circuit portion 30, to the battery-reverse-connection protection circuit portion 34, and to the malfunction detection circuit portion 35. The voltage-controlled circuit portion 29 generates various voltages in accordance with a signal of the input circuit portion 28 and a signal of the protection circuit portion 30.

In the present preferred embodiment, the voltage-controlled circuit portion 29 includes a driving voltage circuit portion 36, a first constant voltage circuit portion 37, a second constant voltage circuit portion 38, and a reference voltage/reference current circuit portion 39.

The driving voltage circuit portion 36 generates a driving voltage to drive the gate drive control circuit portion 31. The driving voltage may be set at a value obtained by subtracting a predetermined value from the power-supply voltage. The driving voltage may be set at about 7 V to 9 V obtained by subtracting 5 V from the power-supply voltage. The driving voltage is input into the gate drive control circuit portion 31.

The first constant voltage circuit portion 37 generates a first constant voltage to drive the protection circuit portion 30. The first constant voltage may be about 5 V. The first constant voltage circuit portion 37 may include a Zener diode. The first constant voltage generated by the first constant voltage circuit portion 37 is input into the protection circuit portion 30 (more specifically, into, for example, a load-open detection circuit portion 41 described later).

The second constant voltage circuit portion 38 generates a second constant voltage to drive the protection circuit portion 30. The first constant voltage may be about 5 V. The second constant voltage circuit portion 38 may include a regulator circuit.

The second constant voltage generated by the second constant voltage circuit portion 38 is input into the protection circuit portion 30 (more specifically, into an overheat protection circuit portion 42 described later or into a low-voltage malfunction restraining circuit portion 43 described later). The reference voltage/reference current circuit portion 39 generates reference voltages and reference currents of various circuit portions. The reference voltage may be about 5 V. The reference current may be not less than 1 mA and not more than 1 A.

The reference voltage and the reference current generated by the reference voltage/reference current circuit portion 39 are input into various circuit portions. If the various circuit portions include a comparator, the reference voltage and the reference current are input into this comparator.

The protection circuit portion 30 is connected to the gate drive control circuit portion 31, to the malfunction detection circuit portion 35, to the source of the sensor MISFET 27, and to the source of the output power MISFET 18. The protection circuit portion 30 includes an overcurrent protection circuit portion 40, a load-open detection circuit portion 41, a overheat protection circuit portion 42, and a low-voltage malfunction restraining circuit portion 43.

The overcurrent protection circuit portion 40 is connected to the gate drive control circuit portion 31 and to the source of the sensor MISFET 27. The overcurrent protection circuit portion 40 protects the output power MISFET 18 from overcurrent.

The overcurrent protection circuit portion 40 may include a current monitoring circuit. A signal generated by the overcurrent protection circuit portion 40 is input into the gate drive control circuit portion 31 (more specifically, into a driving-signal output circuit portion 46 described later).

The load-open detection circuit portion 41 is connected to the voltage-controlled circuit portion 29 and to the source of the output power MISFET 18. The load-open detection circuit portion 41 detects a short state or an open state of the output power MISFET 18. A signal generated by the load-open detection circuit portion 41 is input into the voltage-controlled circuit portion 29.

The overheat protection circuit portion 42 monitors the temperature of the IPD chip 2. The overheat protection circuit portion 42 may include a temperature-sensitive device, such as a temperature-sensitive diode or a thermistor. The overheat protection circuit portion 42 protects the output power MISFET 18 from an excessive rise in temperature. A signal generated by the overheat protection circuit portion 42 is input into the voltage-controlled circuit portion 29.

The low-voltage malfunction restraining circuit portion 43 restrains the malfunction of the output power MISFET 18 in a case in which the power-supply voltage is less than a predetermined value. A signal generated by the low-voltage malfunction restraining circuit portion 43 is input into the voltage-controlled circuit portion 29.

The voltage of the protection circuit portion 30 is monitored by the malfunction detection circuit portion 35. In a case in which a defect occurs in any one among the overcurrent protection circuit portion 40, the load-open detection circuit portion 41, the overheat protection circuit portion 42, and the low-voltage malfunction restraining circuit portion 43 in the protection circuit portion 30, a variation occurs in the voltage of the protection circuit portion 30. The voltage of the protection circuit portion 30 that has varied is input into the malfunction detection circuit portion 35 as a voltage detection signal.

The gate drive control circuit portion 31 is connected to the gate of the output power MISFET 18 and to the gate of the sensor MISFET 27. The gate drive control circuit portion 31 generates a gate driving signal in accordance with a signal of the voltage-controlled circuit portion 29 and a signal of the protection circuit portion 30.

The gate driving signal is a signal to turn on/off the gate of the output power MISFET 18 and the gate of the sensor MISFET 27. A gate driving signal emitted from the gate drive control circuit portion 31 is input into the gate of the output power MISFET 18 and into the gate of the sensor MISFET 27.

More specifically, the gate drive control circuit portion 31 includes an oscillation circuit portion 44, a charge pump circuit portion 45, and the driving-signal output circuit portion 46. The oscillation circuit portion 44 oscillates in accordance with a signal of the voltage-controlled circuit portion 29. A signal generated by the oscillation circuit portion 44 is input into the charge pump circuit portion 45.

The charge pump circuit portion 45 boosts the signal of the oscillation circuit portion 44. The signal generated by the charge pump circuit portion 45 is input into the driving-signal output circuit portion 46. The driving-signal output circuit portion 46 generates a gate driving signal in accordance with a signal of the charge pump circuit portion 45 and a signal of the protection circuit portion 30 (more specifically, the overcurrent protection circuit portion 40).

A gate driving signal generated by the driving-signal output circuit portion 46 is input into the gate of the output power MISFET 18 and into the gate of the sensor MISFET 27. As a result, the sensor MISFET 27 and the output power MISFET 18 are controllably driven at the same time.

The active clamp circuit portion 32 is connected to the power supply terminal 21, to the gate of the output power MISFET 18, and to the gate of the sensor MISFET 27. The active clamp circuit portion 32 protects the output power MISFET 18 from a surge voltage. The surge voltage may include a turnoff surge voltage that can be generated when a voltage being applied to the power supply terminal 21 is switched to an off state.

The active clamp circuit portion 32 may include two diodes that make a reverse bias connection with each other. The two diodes may include a Zener diode and a p-n junction diode.

The current detection circuit portion 33 is connected to the source of the sensor MISFET 27 and to the source of the output power MISFET 18. The current detection circuit portion 33 generates a current detection signal in accordance with a signal generated by the sensor MISFET 27 and a signal generated by the output power MISFET 18. The current detection signal generated by the current detection circuit portion 33 is input into the malfunction detection circuit portion 35.

The battery-reverse-connection protection circuit portion 34 is connected to the ground terminal 24 and to the gate drive control circuit portion 31. When a battery is reversely connected, the battery-reverse-connection protection circuit portion 34 protects the voltage-controlled circuit portion 29, the output power MISFET 18, etc., from a reverse voltage.

The malfunction detection circuit portion 35 includes a first multiplexer circuit portion 47 and a second multiplexer circuit portion 48. The first multiplexer circuit portion 47 includes two input portions and one output portion. The second multiplexer circuit portion 48 includes two input portions, one output portion, and one selection control input portion.

The ENABLE terminal 25 and the output portion of the second multiplexer circuit portion 48 are each connected to the input portion of the first multiplexer circuit portion 47. The SENSE terminal 26 is connected to the output portion of the first multiplexer circuit portion 47.

The protection circuit portion 30 and the current detection circuit portion 33 are each connected to the input portion of the second multiplexer circuit portion 48. The SENSE terminal 26 is connected to the output portion of the second multiplexer circuit portion 48. The voltage-controlled circuit portion 29 is connected to the selection control input portion of the second multiplexer circuit portion 48.

The second multiplexer circuit portion 48 generates a malfunction detection signal in accordance with a signal of the voltage-controlled circuit portion 29, a voltage detection signal of the protection circuit portion 30, and a current detection signal of the current detection circuit portion 33. The malfunction detection signal generated by the second multiplexer circuit portion 48 is input into the first multiplexer circuit portion 47.

If an MCU is connected to the ENABLE terminal 25 and if a resistor is connected to the SENSE terminal 26, an on signal is input into the ENABLE terminal 25 from the MCU, and the malfunction detection signal is taken out from the SENSE terminal 26. The malfunction detection signal is converted into an electric signal by the resistor connected to the SENSE terminal 26. Based on this electric signal, a malfunction in the state of the IPD chip 2 is detected.

Figure 4:
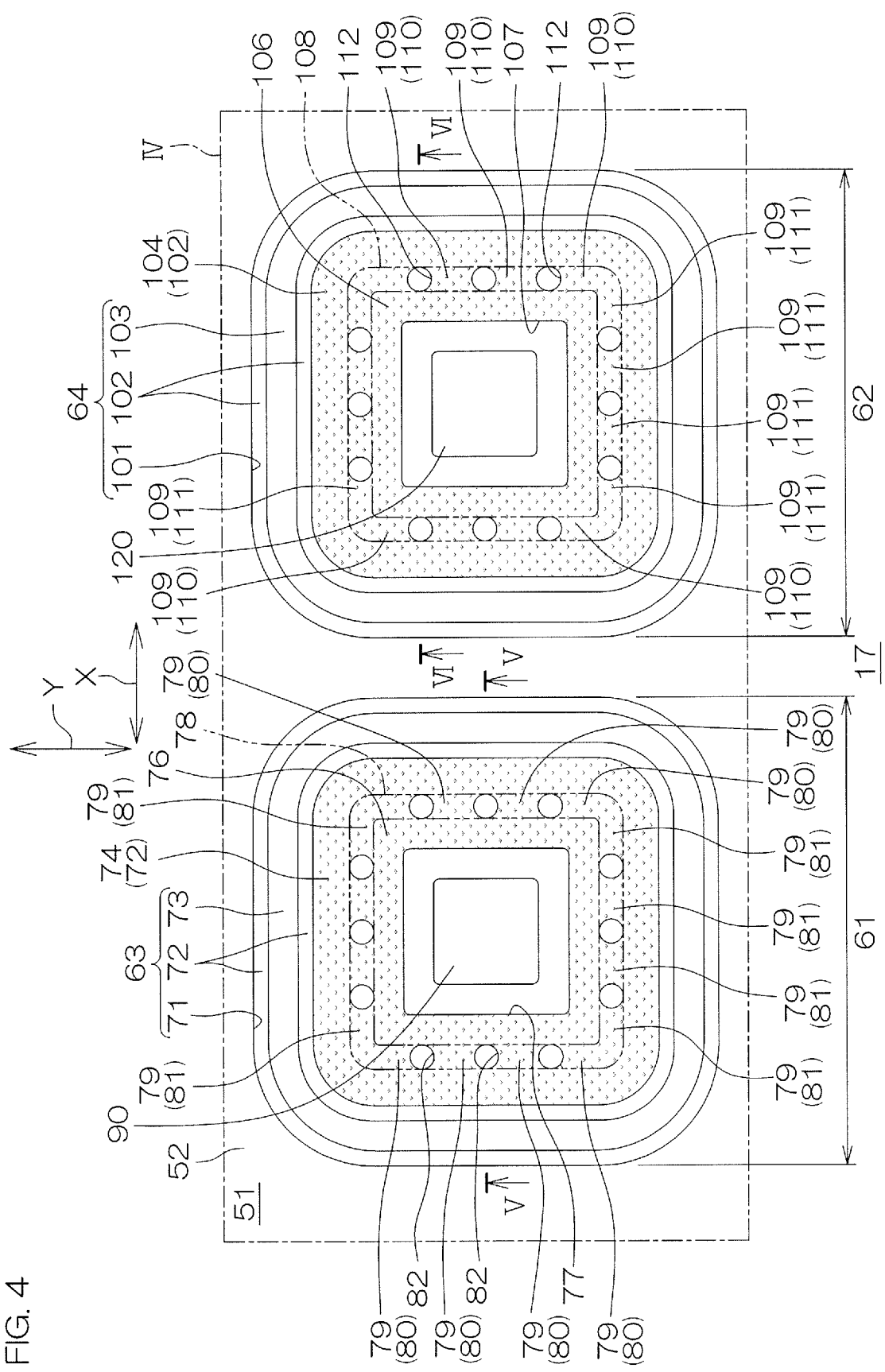
FIG. 4 is an enlarged view of region IV shown in FIG. 2.
Figure 5:
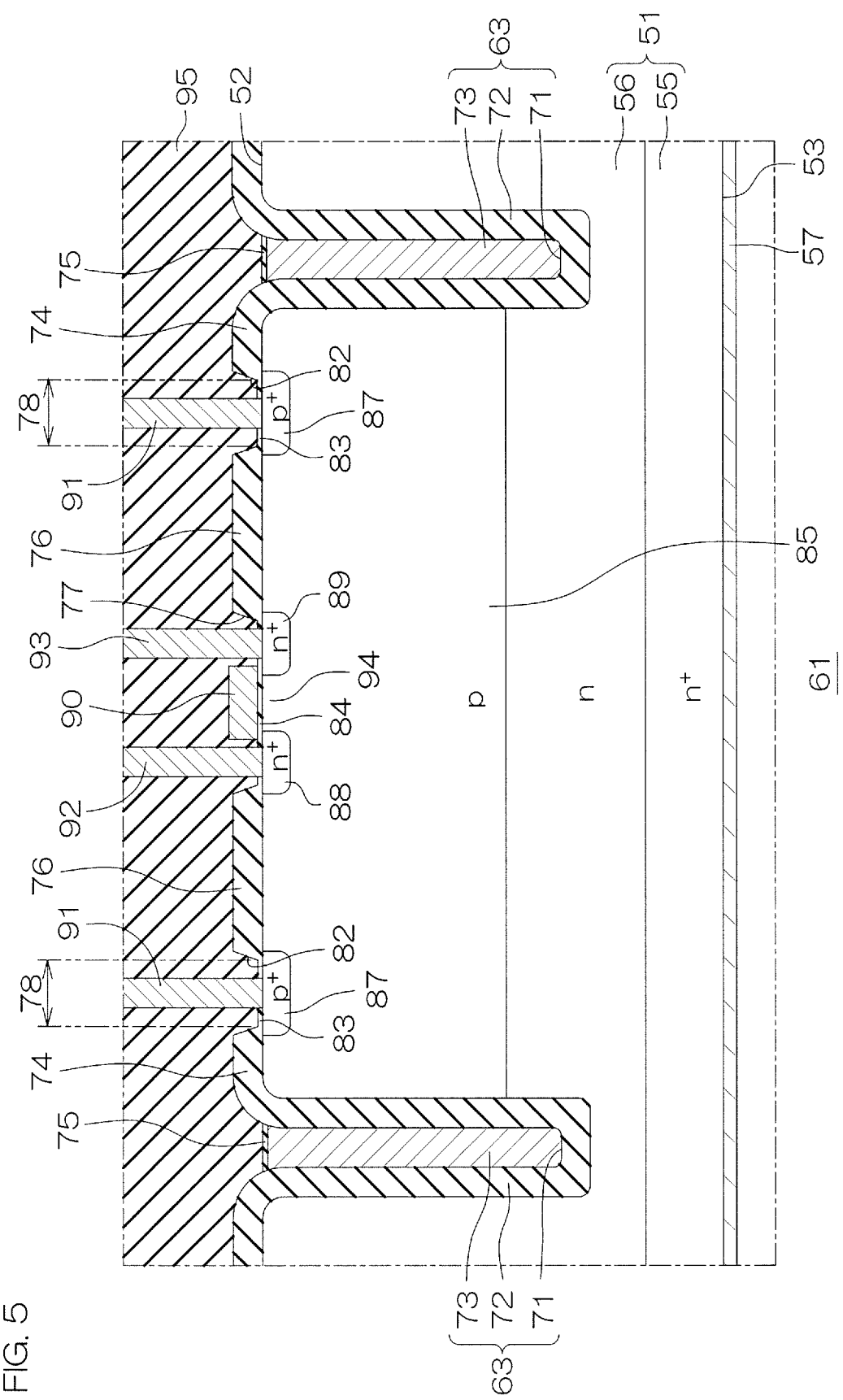
FIG. 5 is a cross-sectional view taken along line V-V shown in FIG. 4.
Figure 6:
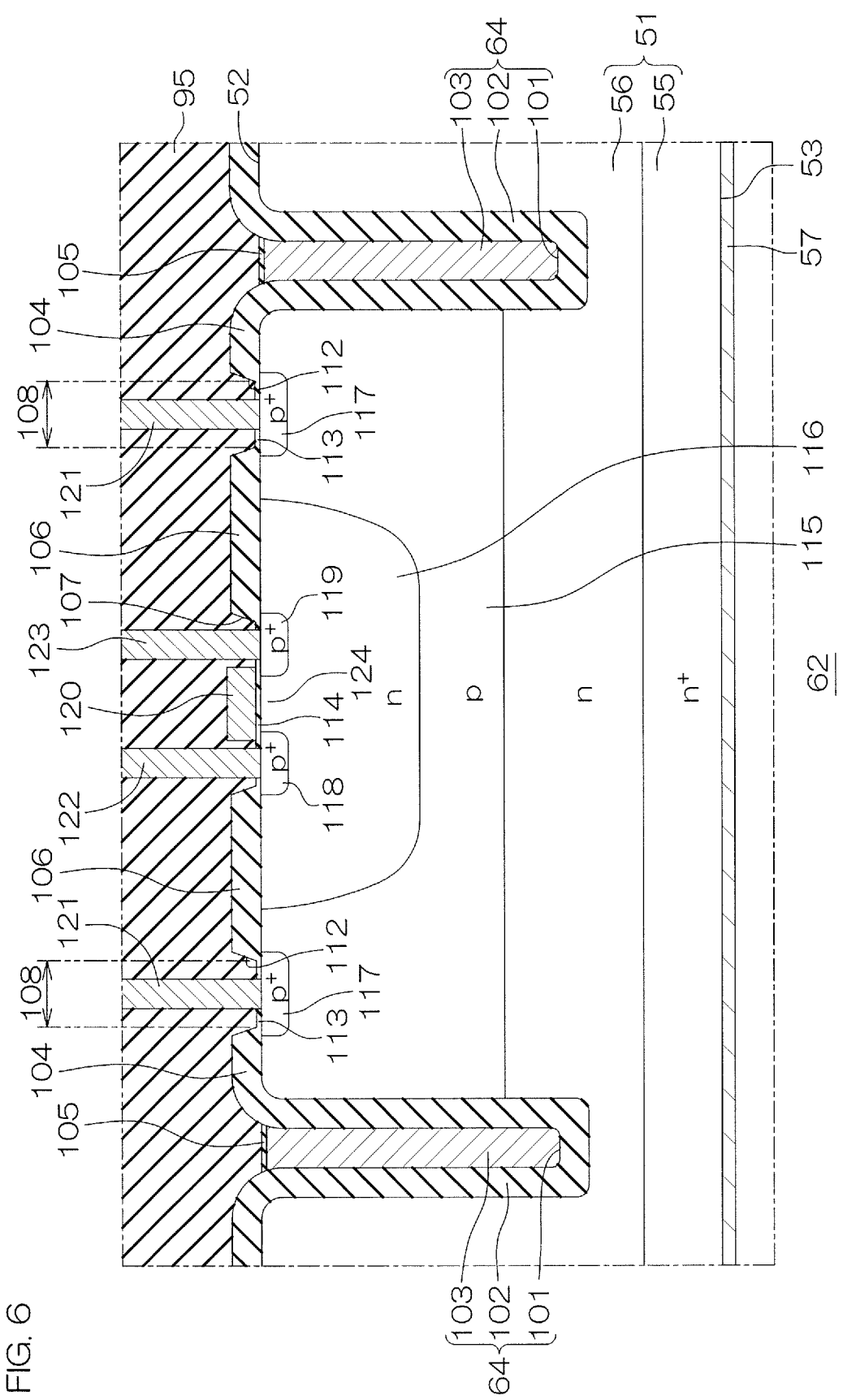
FIG. 6 is a cross-sectional view taken along line VI-VI shown in FIG. 4.

FIG. 4 is an enlarged view of region IV shown in FIG. 2. FIG. 5 is a cross-sectional view taken along line V-V shown in FIG. 4. FIG. 6 is a cross-sectional view taken along line VI-VI shown in FIG. 4.

With reference to FIG. 4 to FIG. 6, the IPD chip 2 includes a semiconductor layer 51. The semiconductor layer 51 is formed in a rectangular parallelepiped shape. The semiconductor layer 51 has a first main surface 52 on one side, a second main surface 53 on an opposite side, and a side surface 54 that connects the first main surface 52 and the second main surface 53 together (see FIG. 2). The first main surface 52 and the second main surface 53 are each formed in a quadrangular shape (more specifically, a rectangular shape) in a plan view seen from normal directions thereof (hereinafter, referred to simply as a "plan view").

In the present preferred embodiment, the semiconductor layer 51 has a layered structure that includes a semiconductor substrate 55 of an n-type and epitaxial layer 56 of an n⁻-type formed on the semiconductor substrate 55. The epitaxial layer 56 has an n-type impurity concentration lower than an n-type impurity concentration of the semiconductor substrate 55.

The second main surface 53 of the semiconductor layer 51 is formed by the semiconductor substrate 55. The first main surface 52 of the semiconductor layer 51 is formed by the epitaxial layer 56. The side surface 54 of the semiconductor layer 51 is formed by both the semiconductor substrate 55 and the epitaxial layer 56.

A second-main surface-side electrode 57 is formed on the second main surface 53 of the semiconductor layer 51. The second-main surface-side electrode 57 is connected to the die pad 3 through the conductive bonding material 19 (also see FIG. 1).

The CMIS region 17 that is an example of an active region is formed at the first main surface 52 of the semiconductor layer 51 in the input region 13 of the IPD chip 2. The CMIS region 17 includes an n-type MIS region 61 (defined region) and a p-type MIS region 62 (defined region) that are electrically separated from each other. The CMIS region 17 further includes a first device isolation structure 63 and a second device isolation structure 64. In the present preferred embodiment, the first device isolation structure 63 and the second device isolation structure 64 are formed away from each other.

The first device isolation structure 63 defines the n-type MIS region 61 so as to be divided from other regions. The first device isolation structure 63 is annularly formed so as to surround the n-type MIS region 61. In the present preferred embodiment, the first device isolation structure 63 is formed in a quadrangular ring shape that surrounds the n-type MIS region 61 in a plan view. The n-type MIS region 61 is defined in a quadrangular shape in a plan view.

The second device isolation structure 64 defines the p-type MIS region 62 so as to be divided from one other region (the n-type MIS region 61). The second device isolation structure 64 is formed in an annular shape that surrounds the p-type MIS region 62. In the present preferred embodiment, the second device isolation structure 64 is formed in a quadrangular ring shape that surrounds the p-type MIS region 62 in a plan view. The p-type MIS region 62 is defined in a quadrangular shape in a plan view.

Hereinafter, a description will be given of a structure on the n-type-MIS-region-61 side with reference to FIG. 4 and FIG. 5, and then a description will be given of a structure on the p-type-MIS-region-62 side with reference to FIG. 4 and FIG. 6.

With reference to FIG. 4 and FIG. 5, a first trench 71 that defines the n-type MIS region 61 is formed at a surface layer portion of the first main surface 52 of the semiconductor layer 51 in the n-type MIS region 61. The first trench 71 is formed in a quadrangular ring shape that surrounds the n-type MIS region 61 in a plan view.

The depth of the first trench 71 may be not less than 1 μm and not more than 10 μm. The depth of the first trench 71 may be not less than 1 μm and not more than 2 μm, be not less than 2 μm and not more than 4 μm, be not less than 4 μm and not more than 6 μm, be not less than 6 μm and not more than 8 μm, or be not less than 8 μm and not more than 10 μm. In the present preferred embodiment, the depth of the first trench 71 is about 4 μm.

A first buried layer 73 is formed inside the first trench 71 through a first trench insulation layer 72. The first device isolation structure 63 has a first trench insulation structure including the first trench 71, the first trench insulation layer 72, and the first buried layer 73.

The first trench insulation structure is called a DTI (Deep Trench Isolation) structure or an STI (Shallow Trench Isolation) structure in accordance with the depth or the aspect ratio of the first trench 71.

The first trench insulation layer 72 may include silicon oxide. The first trench insulation layer 72 is formed in a film shape along an inwall of the first trench 71. The first trench insulation layer 72 defines a recessed space inside the first trench 71.

The first trench insulation layer 72 is drawn out from the inside of the first trench 71 onto the first main surface 52 of the semiconductor layer 51. The first trench insulation layer 72 includes a first overlap portion 74 with which the n-type MIS region 61 of the semiconductor layer 51 is covered. In FIG. 4, the first overlap portion 74 is shown by hatching.

The first overlap portion 74 has a predetermined width, and covers a peripheral edge of the n-type MIS region 61. The first overlap portion 74 is formed in a quadrangular ring shape along an inner edge of the first trench 71 in a plan view.

The first overlap portion 74 may be formed in an end-having belt shape along the inner edge of the first trench 71 in a plan view. The first overlap portion 74 is formed as apart of a field insulation layer. The field insulation layer is a region-separating insulation layer that separates a plurality of semiconductor regions formed in the n-type MIS region 61.

The first buried layer 73 is buried in the recessed space defined by the first trench insulation layer 72. The first buried layer 73 may include polysilicon. An exposed surface of the first buried layer 73 is covered with a first cap insulation layer 75. The first cap insulation layer 75 may include silicon oxide.

The ratio T1/W1 of the thickness T1 of the first trench insulation layer 72 with respect to the width W1 of the first trench 71 may be not less than 0.1 and be less than 0.5. The ratio T1/W1 may be not less than 0.1 and not more than 0.2, be not less than 0.2 and not more than 0.3, be not less than 0.3 and not more than 0.4, or be not less than 0.4 and be less than 0.5.

The width W1 of the first trench 71 may be not less than 0.3 μm and not more than 2.0 μm. The width W1 may be not less than 0.3 μm and not more than 0.5 μm, be not less than 0.5 μm and not more than 1.0 μm, or be not less than 1.5 μm and not more than 2.0 μm. In the present preferred embodiment, the width W1 is about 1.6 μm.

The thickness T1 of the first trench insulation layer 72 may be not less than 0.1 μm and not more than 0.5 μm. The thickness T1 may be not less than 0.1 μm and not more than 0.2 μm, be not less than 0.2 μm and not more than 0.3 μm, be not less than 0.3 μm and not more than 0.4 μm, or be not less than 0.4 μm and not more than 0.5 μm. In the present preferred embodiment, the thickness T1 is about 0.3 μm.

A first field insulation layer 76 with which the n-type MIS region 61 is covered is formed on the first main surface 52 of the semiconductor layer 51 in the n-type MIS region 61. In FIG. 4, the first field insulation layer 76 is shown by hatching. The first field insulation layer 76 is formed away from the inner edge of the first trench 71 on the inward-portion side of the n-type MIS region 61.

More specifically, the first field insulation layer 76 is formed away from the first overlap portion 74 of the first trench insulation layer 72. The first field insulation layer 76 has a thickness T2 (T1=T2) that is substantially equal to the thickness T1 of the first trench insulation layer 72.

A first opening 77 that exposes the first main surface 52 of the semiconductor layer 51 is formed in an inward portion of the first field insulation layer 76. The first opening 77 is formed in a quadrangular shape in a plan view. The first field insulation layer 76 is formed in a quadrangular ring shape in a plan view. In other words, the first field insulation layer 76 is formed in a quadrangular ring shape in a plan view so as to define the first opening 77.

A first bridge insulation layer 79 is formed in a first intermediate region 78 between the first trench insulation layer 72 and the first field insulation layer 76. In FIG. 4, the first bridge insulation layer 79 is shown by hatching. The first intermediate region 78 is a region formed in a quadrangular ring shape that surrounds the first field insulation layer 76 in a plan view.

In the present preferred embodiment, the first intermediate region 78 has two regions that extend along an arbitrary first direction X and that face each other along a second direction that intersects the first direction X. In the present preferred embodiment, the first intermediate region 78 has two regions that extend along the second direction and that face each other along the first direction. In the present preferred embodiment, the first direction X is an array direction of both the n-type MIS region 61 and the p-type MIS region 62. A second direction Y is a direction perpendicular to the first direction X.

The first bridge insulation layer 79 is continuous with the first trench insulation layer 72 and with the first field insulation layer 76. More specifically, the first bridge insulation layer 79 is connected to the first field insulation layer 76 and to the first overlap portion 74. The first bridge insulation layer 79 has a thickness T3 (T1=T2=T3) that is substantially equal to the thickness T1 of the first trench insulation layer 72 and to the thickness T2 of the first field insulation layer 76.

The first bridge insulation layer 79, the first trench insulation layer 72, and the first field insulation layer 76 are formed by one insulation layer that extends continuously and that has a uniform thickness. The first bridge insulation layer 79, the first trench insulation layer 72, and the first field insulation layer 76 may include the same insulating material.

The first bridge insulation layer 79, the first trench insulation layer 72, and the first field insulation layer 76 may each include at least one kind of insulating material among $SiO_2$, AlO, TaO, TiO, AlN, AlSiN, TiN, SiN, NiO, WO, BN, CrN, and SiON. $SiO_2$ and SiN can be mentioned as examples of typical insulating materials of the first bridge insulation layer 79, the first trench insulation layer 72, and the first field insulation layer 76.

In the present preferred embodiment, the first bridge insulation layer 79 includes a plurality of connection parts 80 and 81 formed away from each other in the first intermediate region 78.

The plurality of connection parts 80 and 81 include a pair of first connection parts 80. The pair of first connection parts 80 sandwich both sides of the first field insulation layer 76 from the first direction X. The pair of first connection parts 80 are formed in two regions, respectively, that extend along the second direction Y in the first intermediate region 78 so as to face each other in the first direction X.

In the present preferred embodiment, a plurality of pairs of first connection parts 80 are formed away from each other along the second direction Y. FIG. 4 shows a mode in which five pairs of first connection parts 80 are formed away from each other along the second direction Y.

The expansion and contraction along the first direction X of the first trench insulation layer 72 and the expansion and contraction along the first direction X of the first field insulation layer 76 are regulated by the pair of first connection parts 80. This makes it possible to restrain the occurrence of stress along the first direction X in the semiconductor layer 51.

The plurality of connection parts 80 and 81 include a pair of second connection parts 81. The pair of second connection parts 81 sandwich both sides of the first field insulation layer 76 from the second direction Y. The pair of second connection parts 81 are formed in two regions, respectively, that extend along the first direction X in the first intermediate region 78 so as to face each other in the second direction Y.

In the present preferred embodiment, a plurality of pairs of second connection parts 81 are formed away from each other along the first direction X. FIG. 4 shows a preferred embodiment in which five pairs of second connection parts 81 are formed away from each other along the first direction X.

The second connection part 81 may be continuous with the first connection part 80 in a corner portion of the first intermediate region 78. In other words, the pair of connection parts may sandwich the first field insulation layer 76 from a diagonal direction of the first field insulation layer 76.

The expansion and contraction along the second direction Y of the first trench insulation layer 72 and the expansion and contraction along the second direction Y of the first field insulation layer 76 are regulated by the pair of second connection parts 81. This makes it possible to restrain the occurrence of stress along the second direction Y in the semiconductor layer 51.

As thus described, the width of the first intermediate region 78 is maintained by the first bridge insulation layer 79. This restrains a variation in the relative positional relationship between the first trench insulation layer 72 and the first field insulation layer 76 that results from the thermal expansion or the like of the first field insulation layer 76 and/or of the first trench insulation layer 72.

Therefore, the concentration of stress on the semiconductor layer 51 is restrained, thus restraining the occurrence of a crystal defect in the semiconductor layer 51. The first bridge insulation layer 79 of the n-type MIS region forms a crystal-defect restraining structure that reinforces the semiconductor layer 51 and that restrains a crystal defect on the first main surface 52 of the semiconductor layer 51.

A first contact opening 82 that exposes the first main surface 52 of the semiconductor layer 51 is formed in the first intermediate region 78. In the present preferred embodiment, a plurality of (in the present preferred embodiment, twelve) first contact openings 82 are formed around the first opening 77 of the first field insulation layer 76.

The first contact opening 82 is defined by the first trench insulation layer 72, the first field insulation layer 76, and the first bridge insulation layer 79. The first contact opening 82 is defined in a circular shape in a plan view. The first contact opening 82 may be defined in a polygonal shape, such as a triangular shape, a quadrangular shape, or a hexagonal shape, in a plan view.

A first contact insulation layer 83 with which the first main surface 52 of the semiconductor layer 51 is covered is formed in the first contact opening 82. The first contact insulation layer 83 has a thickness T4 (T4 T1) that is not more than the thickness T1 of the first trench insulation layer 72. The relation T4<T1 may be established.

A first gate insulation layer 84 with which the first main surface 52 of the semiconductor layer 51 is covered is formed in the first opening 77 of the first field insulation layer 76. The first gate insulation layer 84 has a thickness T5 (T5 T1) that is not more than the thickness T1 of the first trench insulation layer 72. The relation T5<T1 may be established.

A well region 85 of the p-type is formed at the surface layer portion of the first main surface 52 of the semiconductor layer 51 in the n-type MIS region 61. The well region 85 is formed up to a halfway portion in a depth direction of the first trench 71. A bottom portion of the well region 85 is formed in a region on the first-main surface-52 side with respect to a bottom wall of the first trench 71. The bottom portion of the well region 85 is in contact with a sidewall of the first trench 71.

A contact region 87 of a p$^+$-type is formed at the surface layer portion of the well region 85. The contact region 87 has a p-type impurity concentration higher than the p-type impurity concentration of the well region 85. The contact region 87 is formed in a region that overlaps with the first contact opening 82 in a plan view.

A source region 88 of an n$^+$-type and a drain region 89 of the n$^+$-type are further formed away from each other at the surface layer portion of the well region 85. The source region 88 and the drain region 89 are respectively formed in regions surrounded by an inwall of the first opening 77 of the first field insulation layer 76 in a plan view. The source region 88 and the drain region 89 may extend in a belt shape along the same direction in a plan view, respectively.

In the n-type MIS region 61, a first gate electrode 90 is formed on the first main surface 52 of the semiconductor layer 51. The first gate electrode 90 is formed on the first gate insulation layer 84. The first gate electrode 90 faces the source region 88 and the drain region 89 with the first gate insulation layer 84 therebetween.

In other words, the first gate electrode 90 faces a channel region 94 of the p-type with the first gate insulation layer 84 therebetween. The channel region 94 is formed by a part interposed between the source region 88 and the drain region 89 in the surface layer portion of the well region 85.

In the n-type MIS region 61, a first contact electrode 91, a first source electrode 92, and a first drain electrode 93 are further formed on the first main surface 52 of the semiconductor layer 51. The first contact electrode 91 passes through the first contact insulation layer 83 and is electrically connected to the contact region 87. The first source electrode 92 passes through the first gate insulation layer 84 and is electrically connected to the source region 88. The first drain electrode 93 passes through the first gate insulation layer 84 and is electrically connected to the drain region 89.

An interlayer insulation layer 95 is formed on the first main surface 52 of the semiconductor layer 51. The interlayer insulation layer 95 covers the first gate electrode 90, the first contact electrode 91, the first source electrode 92, and the first drain electrode 93. The first gate electrode 90, the first contact electrode 91, the first source electrode 92, and the first drain electrode 93 are each exposed from a main surface of the interlayer insulation layer 95.

The interlayer insulation layer 95 may have a monolayer structure including a single insulation layer. The interlayer insulation layer 95 may have a layered structure in which a plurality of insulation layers are laminated together. The interlayer insulation layer 95 may include silicon oxide or silicon nitride.

The interlayer insulation layer 95 may include an insulation layer including silicon oxide. The interlayer insulation layer 95 may include a USG (Undoped Silica Glass) layer. The interlayer insulation layer 95 may have a monolayer structure consisting of a USG layer. In a case in which the interlayer insulation layer 95 includes a USG layer, the interlayer insulation layer 95 may have a flattened main surface. The main surface of the interlayer insulation layer 95 may be a ground surface that is ground according to a CMP (Chemical Mechanical Polishing) method.

With reference to FIG. 4 and FIG. 6, a second trench 101 by which the p-type MIS region 62 is defined is formed at the surface layer portion of the first main surface 52 of the semiconductor layer 51 in the p-type MIS region 62. The second trench 101 is formed in a quadrangular ring shape that surrounds the p-type MIS region 62 in a plan view.

The depth of the second trench 101 may be not less than 1 μm and not more than 10 μm. The depth of the second trench 101 may be not less than 1 μm and not more than 2 μm, be not less than 2 μm and not more than 4 μm, be not less than 4 μm and not more than 6 μm, be not less than 6 μm and not more than 8 μm, or be not less than 8 μm and not more than 10 μm. In the present preferred embodiment, the depth of the second trench 101 is about 4 μm.

A second buried layer 103 is formed in the second trench 101 through a second trench insulation layer 102. The second device isolation structure 64 has a second trench insulation structure that includes the second trench 101, the second trench insulation layer 102, and the second buried layer 103.

The second trench insulation structure is also called a DTI (Deep Trench Isolation) structure or an STI (Shallow Trench Isolation) structure in accordance with the depth or the aspect ratio of the second trench 101.

The second trench insulation layer 102 may include silicon oxide. The second trench insulation layer 102 is formed in a film shape along an inwall of the second trench 101. The second trench insulation layer 102 defines a recessed space inside the second trench 101.

The second trench insulation layer 102 is drawn out from the inside of the second trench 101 onto the first main surface 52 of the semiconductor layer 51. The second trench insulation layer 102 includes a second overlap portion 104 with which the p-type MIS region 62 of the semiconductor layer 51 is covered. In FIG. 4, the second overlap portion 104 is shown by hatching.

The second overlap portion 104 has a predetermined width, and covers a peripheral edge of the p-type MIS region 62. The second overlap portion 104 is formed in a quadrangular ring shape along an inner edge of the second trench 101 in a plan view.

The second overlap portion 104 may be formed in an end-having belt shape along the inner edge of the second trench 101 in a plan view. The second overlap portion 104 is formed as a part of a field insulation layer. The field insulation layer is a region-separating insulation layer that separates a plurality of semiconductor regions formed in the p-type MIS region 62.

The second buried layer 103 is buried in a the recessed space defined by the second trench insulation layer 102. The second buried layer 103 may include polysilicon. An exposed surface of the second buried layer 103 is covered with a second cap insulation layer 105. The second cap insulation layer 105 may include silicon oxide.

The ratio T6/W2 of the thickness T6 of the second trench insulation layer 102 with respect to the width W2 of the second trench 101 may be not less than 0.1 and be less than 0.5. The ratio T6/W2 may be not less than 0.1 and not more than 0.2, be not less than 0.2 and not more than 0.3, be not less than 0.3 and not more than 0.4, or be not less than 0.4 and be less than 0.5.

The width W2 of the second trench 101 may be not less than 0.3 µm and not more than 2.0 µm. The width W2 may be not less than 0.3 µm and not more than 0.5 µm, be not less than 0.5 µm and not more than 1.0 µm, or be not less than 1.5 µm and not more than 2.0 µm. In the present preferred embodiment, the width W2 is about 1.6 µm.

The thickness T6 of the second trench insulation layer 102 may be not less than 0.1 µm and not more than 0.5 µm. The thickness T6 may be not less than 0.1 µm and not more than 0.2 µm, be not less than 0.2 µm and not more than 0.3 µm, be not less than 0.3 µm and not more than 0.4 µm, or be not less than 0.4 µm and not more than 0.5 µm. In the present preferred embodiment, the thickness T6 is about 0.3 µm.

The width W2 of the second trench 101 may be substantially equal to the width W1 of the first trench 71 (W2=W1). The thickness T6 of the second trench insulation layer 102 may be substantially equal to the thickness T1 of the first trench insulation layer 72 (T1=T6).

A second field insulation layer 106 with which the p-type MIS region 62 is covered is formed on the first main surface 52 of the semiconductor layer 51 in the p-type MIS region 62. In FIG. 4, the second field insulation layer 106 is shown by hatching. The second field insulation layer 106 is formed away from the inner edge of the second trench 101 on the inward-portion side of the p-type MIS region 62.

More specifically, the second field insulation layer 106 is formed away from the second overlap portion 104 of the second trench insulation layer 102. The second field insulation layer 106 has a thickness T7 (T6=T7) that is substantially equal to the thickness T6 of the second trench insulation layer 102. The thickness T7 of the second field insulation layer 106 may be substantially equal to the thickness T2 of the first field insulation layer 76 (T2=T7).

A second opening 107 that exposes the first main surface 52 of the semiconductor layer 51 is formed in an inward portion of the second field insulation layer 106. The second opening 107 is formed in a quadrangular shape in a plan view. The second field insulation layer 106 is formed in a quadrangular ring shape in a plan view. In other words, the second field insulation layer 106 is formed in a quadrangular ring shape in a plan view so as to define the second opening 107.

A second bridge insulation layer 109 is formed in a second intermediate region 108 between the second trench insulation layer 102 and the second field insulation layer 106. In FIG. 4, the second bridge insulation layer 109 is shown by hatching. The second intermediate region 108 is a region formed in a quadrangular ring shape that surrounds the second field insulation layer 106 in a plan view.

In the present preferred embodiment, the second intermediate region 108 has two regions that extend along the first direction X and that face each other along the second direction. In the present preferred embodiment, the second intermediate region 108 has two regions that extend along the second direction and that face each other along the first direction.

The second bridge insulation layer 109 is continuous with the second trench insulation layer 102 and with the second field insulation layer 106. More specifically, the second bridge insulation layer 109 is connected to the second field insulation layer 106 and to the second overlap portion 104.

The second bridge insulation layer 109 has a thickness T8 (T6=T7=T8) that is substantially equal to the thickness T6 of the second trench insulation layer 102 and substantially equal to the thickness T7 of the second field insulation layer 106. The thickness T8 of the second bridge insulation layer 109 may be substantially equal to the thickness T3 of the first bridge insulation layer 79 (T3=T8).

The second bridge insulation layer 109, the second trench insulation layer 102, and the second field insulation layer 106 are formed by one insulation layer that extends continuously and that has a uniform thickness. The second bridge insulation layer 109, the second trench insulation layer 102, and the second field insulation layer 106 may include the same insulating material.

The second bridge insulation layer 109, the second trench insulation layer 102, and the second field insulation layer 106 may each include at least one kind of insulating material among $SiO_2$, Ala, TaO, TiO, AlN, AlSiN, TiN, SiN, NiO, WO, BN, CrN, and SiON. $SiO_2$ and SiN can be mentioned as examples of typical insulating materials of the second bridge insulation layer 109, the second trench insulation layer 102, and the second field insulation layer 106.

The second bridge insulation layer 109, the second trench insulation layer 102, and the second field insulation layer 106 may be formed by one insulation layer that extends continuously and that has a uniform thickness together with the first bridge insulation layer 79, the first trench insulation layer 72, and the first field insulation layer 76.

The second bridge insulation layer 109, the second trench insulation layer 102, and the second field insulation layer 106 may include the same insulating material as the first bridge insulation layer 79, the first trench insulation layer 72, and the first field insulation layer 76.

In the present preferred embodiment, the second bridge insulation layer 109 includes a plurality of connection parts 110 and 111 formed away from each other in the second intermediate region 108.

The plurality of connection parts 110 and 111 include a pair of first connection parts 110. The pair of first connection parts 110 sandwich both sides of the second field insulation layer 106 from the first direction X. The pair of first connection parts 110 are formed in two regions, respectively, that extend along the second direction Y in the second intermediate region 108 so as to face each other in the first direction X.

In the present preferred embodiment, a plurality of pairs of first connection parts 110 are formed away from each other along the second direction Y. FIG. 4 shows a preferred embodiment in which five pairs of first connection parts 110 are formed away from each other along the second direction Y.

The expansion and contraction along the first direction X of the second trench insulation layer 102 and the expansion and contraction along the first direction X of the second field insulation layer 106 are regulated by the pair of first connection parts 110. This makes it possible to restrain the occurrence of stress along the first direction X in the semiconductor layer 51.

The plurality of connection parts 110 and 111 include a pair of second connection parts 111. The pair of second connection parts 111 sandwich both sides of the second field insulation layer 106 from the second direction Y. The pair of second connection parts 111 are formed in two regions, respectively, that extend along the first direction X in the second intermediate region 108 so as to face each other in the second direction Y.

In the present preferred embodiment, a plurality of pairs of second connection parts 111 are formed away from each other along the first direction X. FIG. 4 shows a mode in which five pairs of second connection parts 111 are formed away from each other along the first direction X.

The second connection part 81 may be continuous with the first connection part 110 in a corner portion of the second intermediate region 108. In other words, the pair of connection parts may sandwich the second field insulation layer 106 from a diagonal direction of the second field insulation layer 106.

The expansion and contraction along the second direction Y of the second trench insulation layer 102 and the expansion and contraction along the second direction Y of the second field insulation layer 106 are regulated by the pair of second connection parts 111. This makes it possible to restrain the occurrence of stress along the second direction Y in the semiconductor layer 51.

As thus described, the width of the second intermediate region 108 is maintained by the second bridge insulation layer 109. This restrains a variation in the relative positional relationship between the second trench insulation layer 102 and the second field insulation layer 106 that results from the thermal expansion or the like of the second field insulation layer 106 and/or of the second trench insulation layer 102.

Therefore, the concentration of stress on the semiconductor layer 51 is restrained. This restrains the occurrence of a crystal defect in the semiconductor layer 51. The second bridge insulation layer 109 forms a crystal-defect restraining structure that reinforces the semiconductor layer 51 and that restrains a crystal defect on the first main surface 52 of the semiconductor layer 51 of the p-type MIS region 62.

A second contact opening 112 that exposes the first main surface 52 of the semiconductor layer 51 is formed in a region between the second trench insulation layer 102 and the second field insulation layer 106 in the p-type MIS region 62. In the present preferred embodiment, a plurality of (in the present preferred embodiment, twelve) second contact openings 112 are defined around the second opening 107 of the second field insulation layer 106.

The second contact opening 112 is defined by the second trench insulation layer 102, the second field insulation layer 106, and the second bridge insulation layer 109. The second contact opening 112 is defined in a circular shape in a plan view. The second contact opening 112 may be defined in a polygonal shape, such as a triangular shape, a quadrangular shape, or a hexagonal shape, in a plan view.

A second contact insulation layer 113 with which the first main surface 52 of the semiconductor layer 51 is covered is formed in the second contact opening 112. The second contact insulation layer 113 has a thickness T9 (T9 T6) that is not more than the thickness T6 of the second trench insulation layer 102. The relation T9<TO may be established.

A second gate insulation layer 114 with which the first main surface 52 of the semiconductor layer 51 is covered is formed in the second opening 107 of the second field insulation layer 106. The second gate insulation layer 114 has a thickness T10 (T10 T6) that is not more than the thickness T6 of the second trench insulation layer 102. The relation T10<T6 may be established.

A p-type well region 115 is formed at the surface layer portion of the semiconductor layer 51 in the p-type MIS region 62. The well region 115 is formed up to a halfway portion in a depth direction of the second trench 101. A bottom portion of the well region 115 is in contact with a sidewall of the second trench 101.

An n-type surface-layer well region 116 is formed at a surface layer portion of the well region 115. The surface-layer well region 116 is formed up to a halfway portion in a depth direction of the well region 115. A bottom portion of the surface-layer well region 116 is positioned in a region on the first-main surface-52 side with respect to the bottom portion of the well region 115. A peripheral edge of the surface-layer well region 116 surrounds the second opening 107 of the second field insulation layer 106 in a plan view.

A contact region 117 of the $p^+$-type is formed at the surface layer portion of the well region 115. The contact region 117 has a p-type impurity concentration higher than the p-type impurity concentration of the well region 115. The contact region 117 is formed in a region that overlaps with the second contact opening 112 in a plan view. The contact region 117 is formed away from the surface-layer well region 116.

A source region 118 of the $p^+$-type and a $p^+$ type drain region 119 of the $p^+$-type are formed away from each other at the surface layer portion of the surface-layer well region 116. The source region 118 and the drain region 119 are respectively formed in regions surrounded by an inwall of the second opening 107 of the second field insulation layer 106 in a plan view. The source region 118 and the drain region 119 may each extend in a belt shape along the same direction in a plan view.

A second gate electrode 120 is formed on the first main surface 52 of the semiconductor layer 51. The second gate electrode 120 is formed on the second gate insulation layer 114. The second gate electrode 120 faces the source region 118 and the drain region 119 with the second gate insulation layer 114 therebetween.

In other words, the second gate electrode 120 faces the channel region 124 of the n-type with the second gate insulation layer 114 therebetween. The channel region 124 is formed by a part interposed between the source region 118 and the drain region 119 in the surface layer portion of the surface-layer well region 116.

A second contact electrode 121, a second source electrode 122, and a second drain electrode 123 are further formed on the first main surface 52 of the semiconductor layer 51. The second contact electrode 121 passes through the second contact insulation layer 113 and is electrically connected to the contact region 117. The second source electrode 122 passes through the second gate insulation layer 114 and is electrically connected to the source region 118. The second drain electrode 123 passes through the second gate insulation layer 114 and is electrically connected to the drain region 119.

The interlayer insulation layer 95 is formed on the first main surface 52 of the semiconductor layer 51. The interlayer insulation layer 95 covers the second gate electrode 120, the second contact electrode 121, the second source electrode 122, and the second drain electrode 123. The second gate electrode 120, the second contact electrode 121, the second source electrode 122, and the second drain electrode 123 are each exposed from the main surface of the interlayer insulation layer 95.

Figure 7:
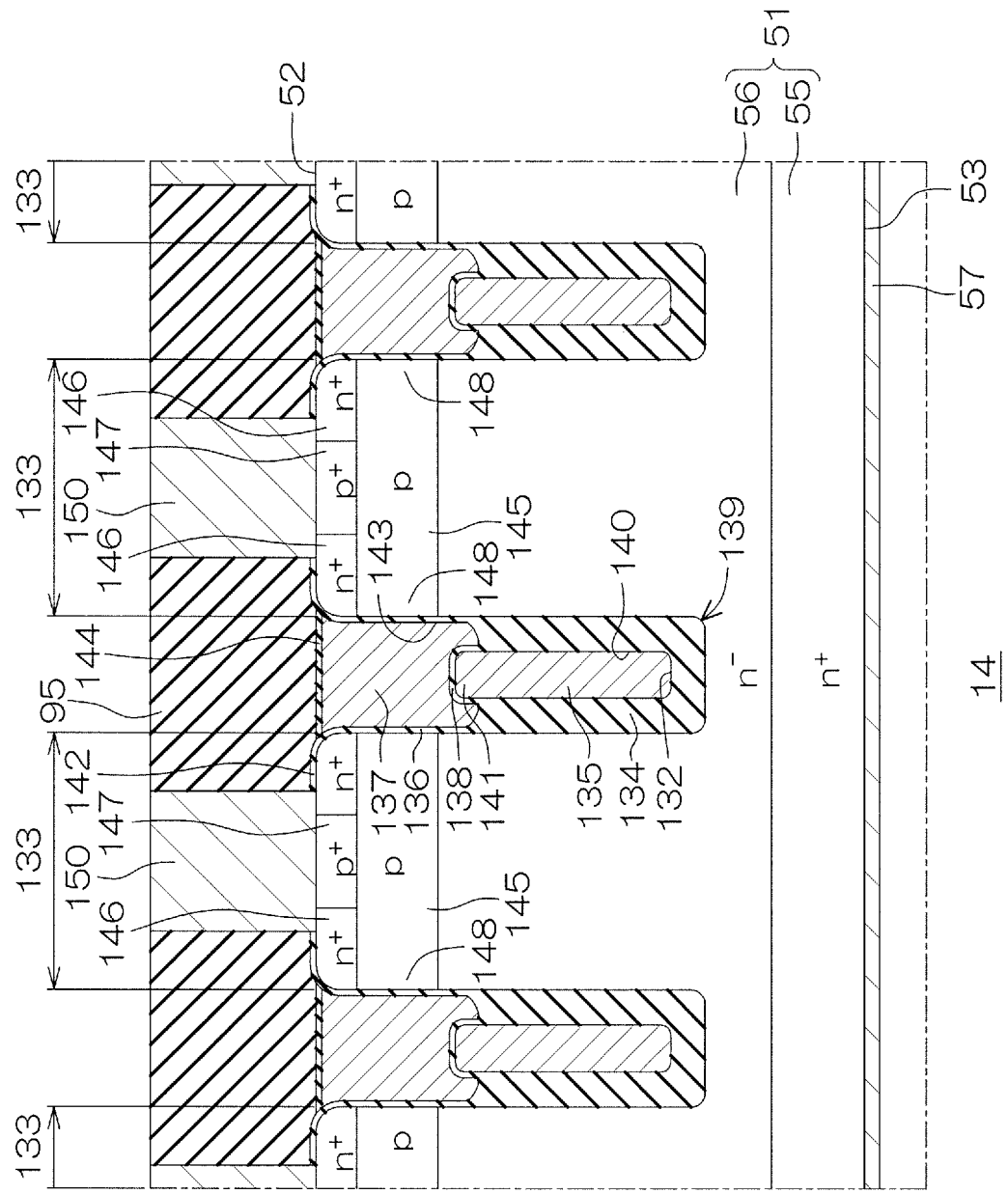
FIG. 7 is a cross-sectional view taken along line VII-VII shown in FIG. 2.

FIG. 7 is a cross-sectional view taken along line VII-VII shown in FIG. 2.

With reference to FIG. 7, the output power MISFET 18 is formed in the output region 14 of the IPD chip 2. The semiconductor substrate 55 functions as a drain region of the output power MISFET 18. The epitaxial layer 56 functions as a drift region of the output power MISFET 18.

A gate trench 132 is formed at the surface layer portion of the first main surface 52 of the semiconductor layer 51 in the output region 14. The gate trench 132 defines a unit cell 133 having a MIS structure. The gate trench 132 is formed in a stripe shape or in a grid shape in a plan view.

The depth of the gate trench 132 may be not less than 1 µm and not more than 10 µm. The depth of the gate trench 132 may be not less than 1 µm and not more than 2 µm, be not less than 2 µm and not more than 4 µm, be not less than 4 µm and not more than 6 µm, be not less than 6 µm and not more than 8 µm, or be not less than 8 µm and not more than 10 µm. In the present preferred embodiment, the depth of the gate trench 132 is about 4 µm.

A lower gate insulation layer 134, a lower gate electrode layer 135, an upper gate insulation layer 136, an upper gate electrode layer 137, and an intermediate insulation layer 138 are formed in the gate trench 132.

The lower gate electrode layer 135 is buried in the bottom-portion side of the gate trench 132 with the lower gate insulation layer 134 therebetween. The upper gate electrode layer 137 is buried in the opening side of the gate trench 132 with the upper gate insulation layer 136 therebetween. The upper gate electrode layer 137 is formed on the lower gate electrode layer 135 in the gate trench 132.

The intermediate insulation layer 138 is formed in a region between the lower gate electrode layer 135 and the upper gate electrode layer 137. The lower gate electrode layer 135 and the upper gate electrode layer 137 are insulated from each other by the intermediate insulation layer 138.

In this manner, a split gate structure 139 including the gate trench 132 is formed in the output region 14. The split gate structure 139 is formed such that two electrodes are separated from each other in an up-down direction by an insulator in the gate trench 132. The split gate structure 139 will be hereinafter described in detail.

The lower gate insulation layer 134 is formed in a film shape along an inwall of the gate trench 132 in a bottom portion of the gate trench 132. The lower gate insulation layer 134 defines a lower recess portion 140 in the bottom portion of the gate trench 132.

The lower gate electrode layer 135 is buried in the lower recess portion 140. The lower gate electrode layer 135 is formed in a wall shape that extends along a sidewall of the gate trench 132. The lower gate electrode layer 135 has a projection portion 141 on the opening side of the gate trench 132. The projection portion 141 protrudes toward the first-main surface-52 side beyond an upper end of the lower gate insulation layer 134. The intermediate insulation layer 138 covers the projection portion 141 of the lower gate electrode layer 135.

The upper gate insulation layer 136 is formed in a film shape along the inwall of the gate trench 132 on the opening side of the gate trench 132. An upper end of the upper gate insulation layer 136 is formed integrally with a main surface insulation layer 142 formed on the first main surface 52 of the semiconductor layer 51. A lower end of the upper gate insulation layer 136 is formed integrally with the upper end of the lower gate insulation layer 134.

A groove is defined by the intermediate insulation layer 138, the lower gate insulation layer 134, and the upper gate insulation layer 136 on both sides of the projection portion 141 of the lower gate electrode layer 135. Hence, an inverted-concave upper recess portion 143 is defined on the opening side of the gate trench 132 in a cross-sectional view.

The upper gate electrode layer 137 is buried in the upper recess portion 143. An exposed surface of the upper gate electrode layer 137 may be placed at a more downward position than the first main surface 52 of the semiconductor layer 51. The exposed surface of the upper gate electrode layer 137 may have a curved plane that is concavely curved toward a bottom wall of the gate trench 132. The exposed surface of the upper gate electrode layer 137 may have a substantially parallel flat surface with respect to the first main surface 52 of the semiconductor layer 51.

The lower gate electrode layer 135 and the upper gate electrode layer 137 may each include polysilicon. In one mode example, a gate voltage may be applied to the lower gate electrode layer 135, and a gate voltage may be applied to the upper gate electrode layer 137 when the output power MISFET 18 is controllably driven. In this case, it is possible to reduce the on-resistance of the semiconductor layer 51.

In another mode example, a gate voltage may be applied to the upper gate electrode layer 137, and a reference voltage (for example, a source voltage) may be applied to the lower gate electrode layer 135 when the output power MISFET 18 is controllably driven. In this case, the lower gate electrode layer 135 functions as a field plate electrode. In this case, it is possible to reduce a parasitic capacitance between the semiconductor layer 51 and the lower gate electrode layer 135.

The lower gate insulation layer 134, the upper gate insulation layer 136, the intermediate insulation layer 138, and the main surface insulation layer 142 may include the same insulating material. The lower gate insulation layer 134, the upper gate insulation layer 136, the intermediate insulation layer 138, and the main surface insulation layer 142 may include mutually different insulating materials.

The lower gate insulation layer 134, the upper gate insulation layer 136, the intermediate insulation layer 138, and the main surface insulation layer 142 may each include at least one kind of insulating material among $SiO_2$, Ala, TaO, TiO, AlN, AlSiN, TiN, SiN, NiO, WO, BN, CrN, and SiON. $SiO_2$ and SiN can be mentioned as examples of typical insulating materials of the lower gate insulation layer 134, the upper gate insulation layer 136, the intermediate insulation layer 138, and the main surface insulation layer 142.

The exposed surface of the upper gate electrode layer 137 is covered with a third cap insulation layer 144. The third cap insulation layer 144 may include silicon oxide.

The thickness T11 of the lower gate insulation layer 134 may be not less than the thickness T12 of the upper gate insulation layer 136 (T11 T12). The relation T11> T12 may be established. The thickness T13 of the intermediate insulation layer 138 may be not more than the thickness T11 of the lower gate insulation layer 134 (T13 T11). The relation T13<T11 may be established.

The thickness T13 of the intermediate insulation layer 138 may be not less than the thickness T12 of the upper gate insulation layer 136 (T13 T12). The relation T13> T12 may be established. The thickness T13 of the intermediate insulation layer 138 may be not more than the thickness T12 of the upper gate insulation layer 136 (T13 T12). The relation T13<T12 may be established.

The ratio T11/W11 of the thickness T11 of the lower gate insulation layer 134 with respect to the width W11 of the gate trench 132 may be not less than 0.1 and be less than 0.5. The ratio T11/W11 may be not less than 0.1 and not more than 0.2, be not less than 0.2 and not more than 0.3, be not less than 0.3 and not more than 0.4, or be not less than 0.4 and be less than 0.5.

The ratio T12/W11 of the thickness T12 of the upper gate insulation layer 136 with respect to the width W11 of the gate trench 132 may be not less than 0.01 and not more than 0.05. The ratio T12/W11 may be not less than 0.01 and not more than 0.02, be not less than 0.02 and not more than 0.03, be not less than 0.03 and not more than 0.04, or be not less than 0.04 and be less than 0.05.

The width W11 of the gate trench 132 may be not less than 0.3 μm and not more than 2.0 μm. The width W11 may be not less than 0.3 μm and not more than 0.5 μm, be not less than 0.5 μm and not more than 1.0 μm, or be not less than 1.5 μm and not more than 2.0 μm. In the present preferred embodiment, the width W11 is about 1.6 μm.

The thickness T11 of the lower gate insulation layer 134 may be not less than 0.1 μm and not more than 0.5 μm. The thickness T11 may be not less than 0.1 μm and not more than 0.2 μm, be not less than 0.2 μm and not more than 0.3 μm, be not less than 0.3 μm and not more than 0.4 μm, or be not less than 0.4 μm and not more than 0.5 μm. In the present preferred embodiment, the thickness T11 is about 0.3 μm.

The thickness T12 of the upper gate insulation layer 136 may be not less than 0.01 μm and not more than 0.05 μm. The thickness T12 may be not less than 0.01 μm and not more than 0.02 μm, be not less than 0.02 μm and not more than 0.03 μm, be not less than 0.03 μm and not more than 0.04 μm, or be not less than 0.04 μm and not more than 0.05 μm. In the present preferred embodiment, the thickness T12 is about 0.03 μm.

The unit cell 133 includes a body region 145 of the p-type. The body region 145 is formed at the surface layer portion of the first main surface 52 of the semiconductor layer 51. The body region 145 is formed up to a halfway portion in a depth direction of the gate trench 132.

A bottom portion of the body region 145 is formed in a region on the first-main surface-52 side with respect to a bottom wall of the gate trench 132. The bottom portion of the body region 145 is in contact with a sidewall of the gate trench 132. The body region 145 is shared between a plurality of gate trenches 132 that adjoin each other.

The unit cell 133 includes an source region 146 of the $n^+$-type. The source region 146 is formed at a surface layer portion of the body region 145. The source region 146 is formed along the sidewall of the gate trench 132. The source region 146 faces the upper gate electrode layer 137 with the upper gate insulation layer 136 therebetween.

The unit cell 133 includes a contact region 147 of the $p^+$-type. The contact region 147 is formed at the surface layer portion of the body region 145. The contact region 147 passes through the source region 146 and is electrically connected to the body region 145. The contact region 147 is formed away from the sidewall of the gate trench 132. The contact region 147 may have a part that is in contact with the sidewall of the gate trench 132.

The upper gate electrode layer 137 faces the source region 146, the body region 145, and a drift region (the epitaxial layer 56) with the upper gate insulation layer 136 therebetween. In other words, the upper gate electrode layer 137 faces a channel region 148 of the p-type with the upper gate insulation layer 136 therebetween. The channel region 148 is formed by a region between the source region 146 and the drift region (the epitaxial layer 56) in the body region 145.

A source pad electrode 150 is formed on the first main surface 52 of the semiconductor layer 51. The source pad electrode 150 is electrically connected to the source region 146 and to the contact region 147.

The interlayer insulation layer 95 is formed on the first main surface 52 of the semiconductor layer 51. The interlayer insulation layer 95 covers the split gate structure 139 and the source pad electrode 150.

FIG. 8 is a plan view that shows a semiconductor device 151 according to a reference example and that is to describe a mechanism by which a crystal defect is caused. FIG. 8 is also a plan view of a part that corresponds to the n-type MIS region 61 of the semiconductor device 1.

In FIG. 8, the same reference sign is given to a structure that is equivalent to the structure of the semiconductor device 1, and a description thereof is omitted. Additionally, a structure on the p-type-MIS-region-62 side is identical with a structure on the n-type-MIS-region-61 side in the semiconductor device 151 according to the reference example, and therefore a description thereof is omitted.

The first bridge insulation layer 79 is not formed in the semiconductor device 151 according to the reference example. The first field insulation layer 76 is formed in an island shape. The first field insulation layer 76 is formed away from the first trench insulation layer 72 and is independently present. The first intermediate region 78 is defined in a region between the first trench insulation layer 72 and the first field insulation layer 76.

The first intermediate region 78 is formed as the first contact opening 82. In other words, in the present preferred embodiment, the first contact opening 82 is formed in a quadrangular ring shape that surrounds the first field insulation layer 76 in a plan view. The contact region 87 is formed in a quadrangular ring shape along the first contact opening 82 in a plan view. The first contact electrode 91 is formed in a quadrangular ring shape along the first contact opening 82 in a plan view.

In the thus formed structure, it is possible to increase the connection area of the first contact electrode 91 with respect to the contact region 87. This makes it possible to stabilize electric potential. However, the expansion-and-contraction influence that results from thermal expansion or the like of the first trench insulation layer 72, of the first buried layer 73, and/or of the first field insulation layer 76 is independently given to the semiconductor layer 51.

As a result, a relative positional relationship among the first trench insulation layer 72, the first buried layer 73, and/or the first field insulation layer 76 varies, and therefore stress occurs in the semiconductor layer 51. When stress occurs in the semiconductor layer 51, a crystal defect 152 (a region surrounded by the broken line) is formed in the semiconductor layer 51. The crystal defect 152 lowers the quality of the semiconductor device 151.

On the other hand, in the semiconductor device 1, the first bridge insulation layer 79 is formed in the first intermediate region 78. Hence, it is possible to keep the width of the first intermediate region 78 at a predetermined value by the first bridge insulation layer 79.

As a result, it is possible to restrain the relative positional relationship between the first trench insulation layer 72 and the first field insulation layer 76 from being varied by the expansion and contraction resulting from the thermal expansion or the like of the first field insulation layer 76 and/or of the first trench insulation layer 72. Therefore, it is possible to restrain stress on the semiconductor layer 51.

Particularly in the semiconductor device 1, the first bridge insulation layer 79 includes a plurality of connection parts formed away from each other in the first intermediate region 78. The plurality of connection parts include a pair of first connection parts 80. The pair of first connection parts 80 sandwich both sides of the first field insulation layer 76 from the first direction X. Hence, it is possible to regulate the expansion and contraction along the first direction X of the first trench insulation layer 72 and the expansion and contraction along the first direction X of the first field insulation layer 76 by the pair of first connection parts 80. As a result, it is possible to appropriately restrain stress along the first direction X in the semiconductor layer 51.

Furthermore, the plurality of connection parts include a pair of second connection parts 81. The pair of second connection parts 81 sandwich both sides of the first field insulation layer 76 from the second direction Y. Hence, it is possible to regulate the expansion and contraction along the second direction Y of the first trench insulation layer 72 and the expansion and contraction along the second direction Y of the first field insulation layer 76 by the pair of second connection parts 81. As a result, it is possible to appropriately restrain stress along the second direction Y in the semiconductor layer 51.

FIG. 9A to FIG. 9J are cross-sectional views to describe a method for manufacturing a part of the semiconductor device 1 of FIG. 1 relative to the input region 13. FIG. 10A to FIG. 10J are cross-sectional views to describe a method for manufacturing a part of the semiconductor device 1 of FIG. 1 relative to the output region 14. In FIG. 9A to FIG. 9J, only the n-type MIS region 61 of the input region 13 is shown.

Figure 9C:
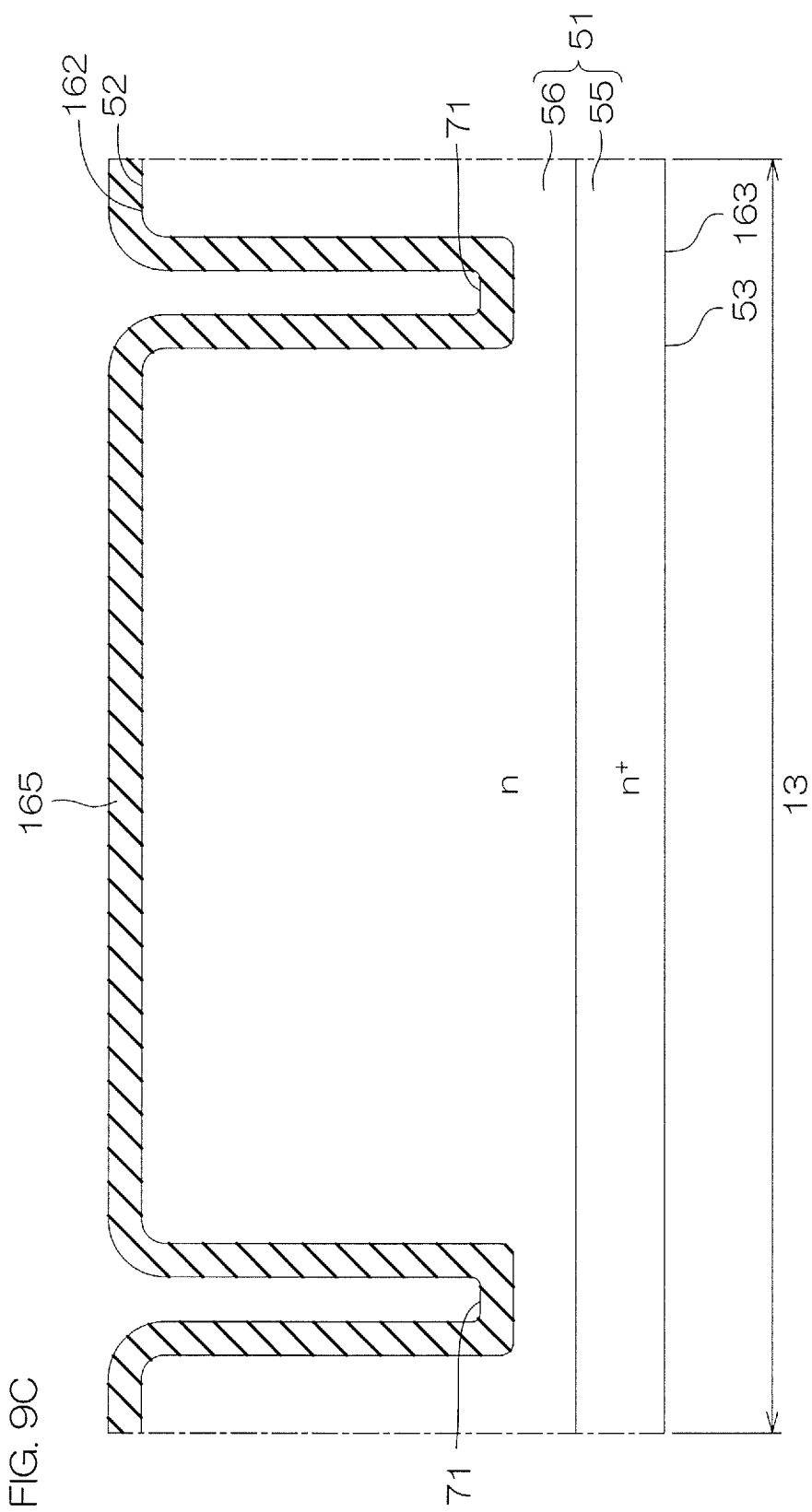
FIG. 9A to FIG. 9J are cross-sectional views to describe a method for manufacturing the semiconductor device of FIG. 1.
Figure 10A:
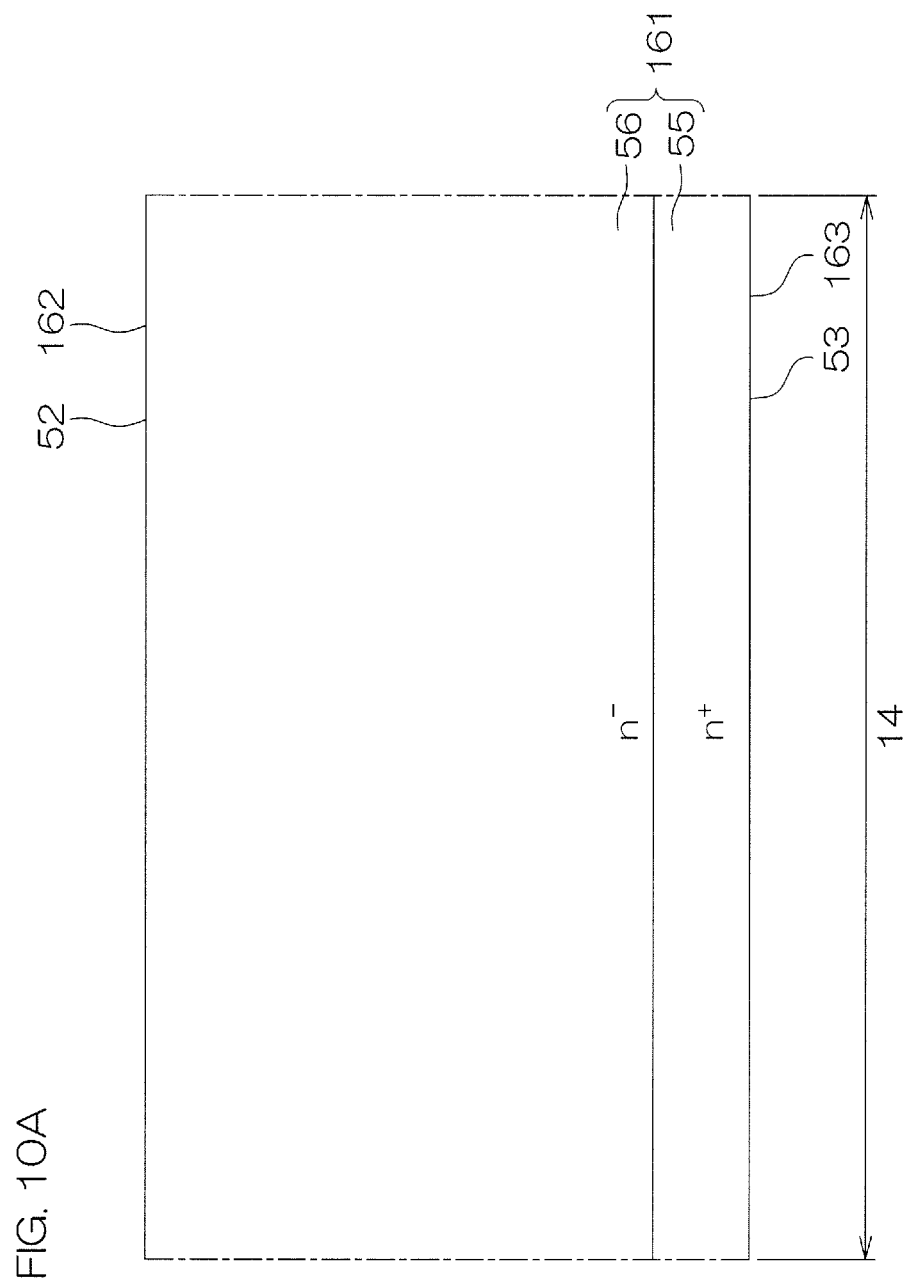

With reference to FIG. 9A and FIG. 10A, a semiconductor wafer 161 is first prepared. The semiconductor wafer 161 may be a semiconductor wafer made of silicon. The semiconductor wafer 161 may be formed in a disk shape.

The semiconductor wafer 161 includes a first main surface 162 on one side and a second main surface 163 on the other side. The first main surface 162 and the second main surface 163 of the semiconductor wafer 161 correspond to the first main surface 52 and the second main surface 53 of the semiconductor layer 51, respectively.

The semiconductor wafer 161 has a layered structure including the semiconductor substrate 55 and the epitaxial layer 56. The epitaxial layer 56 is formed by epitaxially growing silicon from the main surface of the semiconductor substrate 55. The second main surface 163 is formed by the semiconductor substrate 55. The first main surface 162 is formed by the epitaxial layer 56.

Figure 10B:
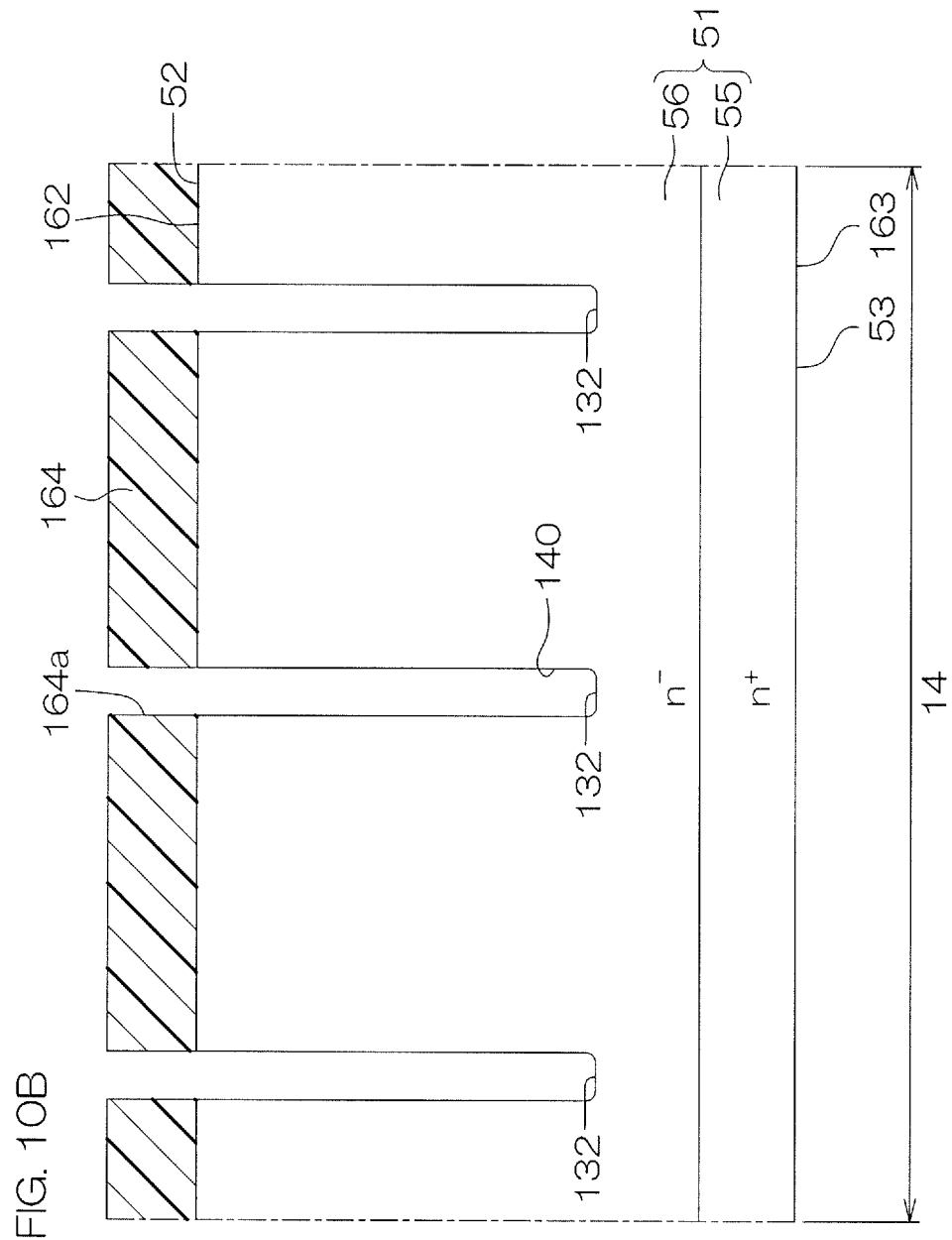

Thereafter, with reference to FIG. 9B and FIG. 10B, the first trench 71, the second trench 101, and the gate trench 132 are formed at the first main surface 162. In this step, a first mask 164 that has a predetermined pattern is first formed on the first main surface 162. The first mask 164 has a plurality of openings 164a that expose regions in which the first trench 71, the second trench 101, and the gate trench 132 are to be formed, respectively.

Thereafter, a needless part of the semiconductor wafer 161 is removed by an etching method through the first mask 164. Hence, the first trench 71, the second trench 101, and the gate trench 132 are formed at the first main surface 162.

Figure 10C:
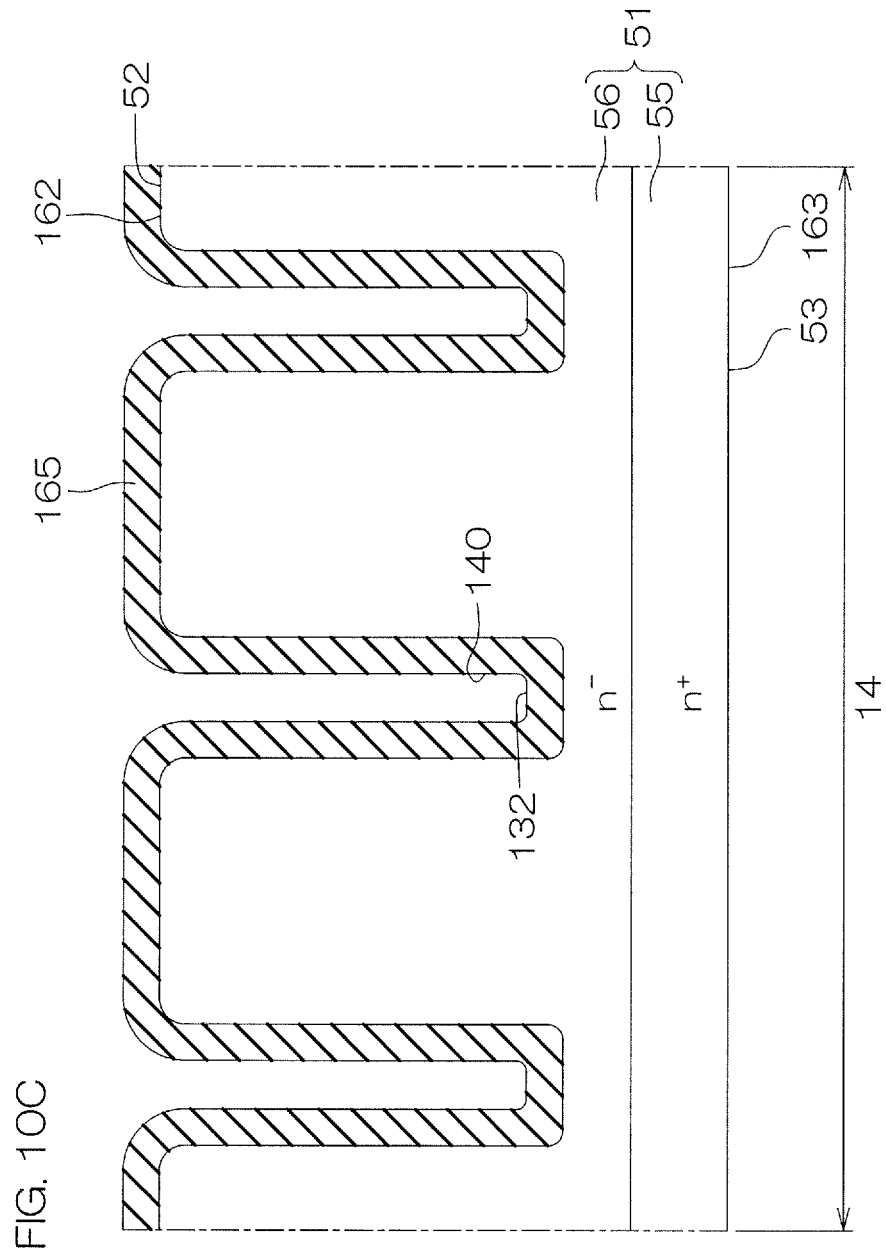

Thereafter, with reference to FIG. 9C and FIG. 10C, an insulation layer 165 is formed on the first main surface 162. The insulation layer 165 is formed along the first main surface 162, the inwall of the first trench 71, the inwall of the second trench 101, and the inwall of the gate trench 132. The insulation layer 165 may be formed by an oxidation treatment method (for example, a thermal oxidation treatment method). The insulation layer 165 may be formed by a CVD (Chemical Vapor Deposition) method.

Figure 9D:
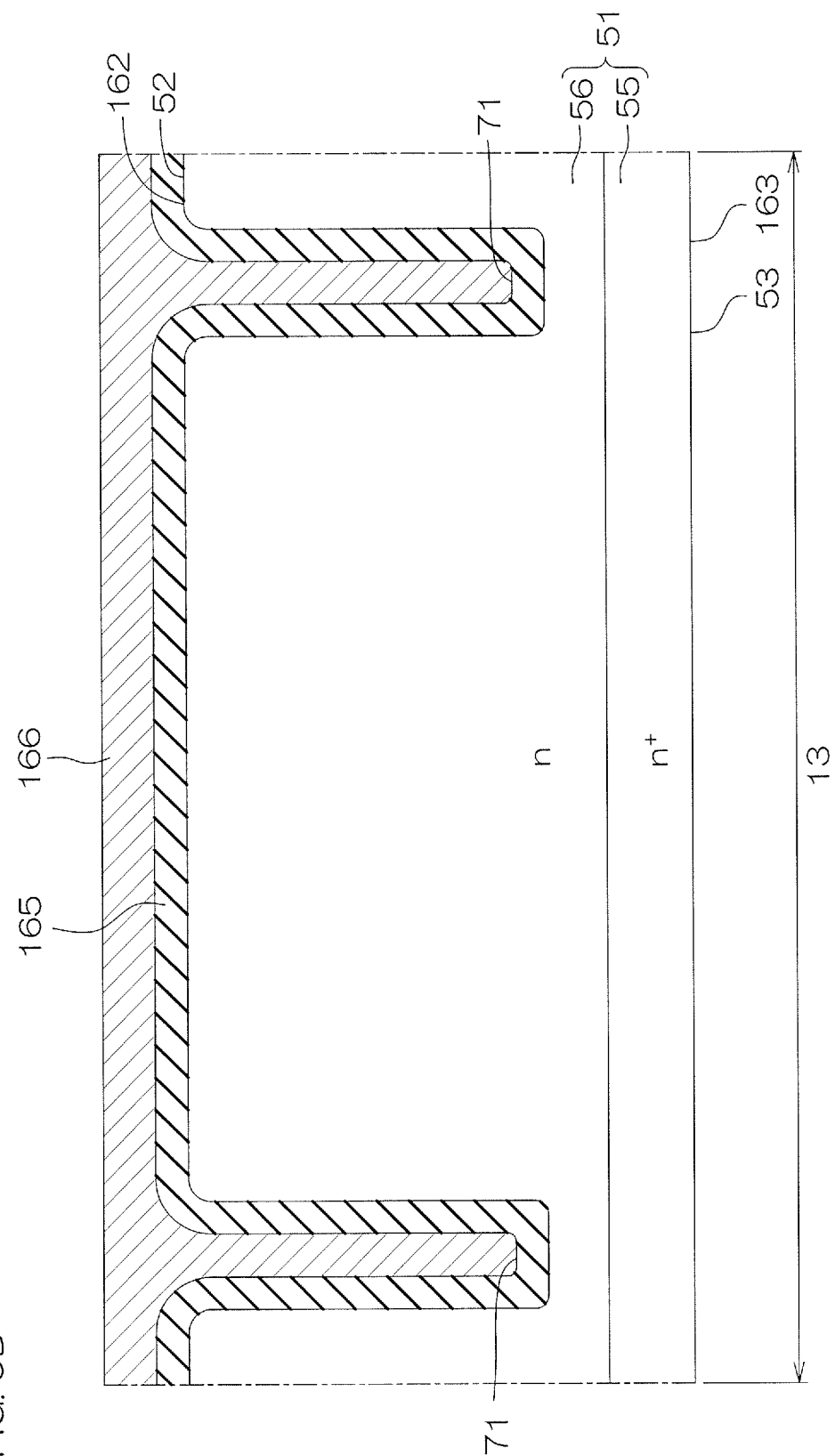
Figure 10D:
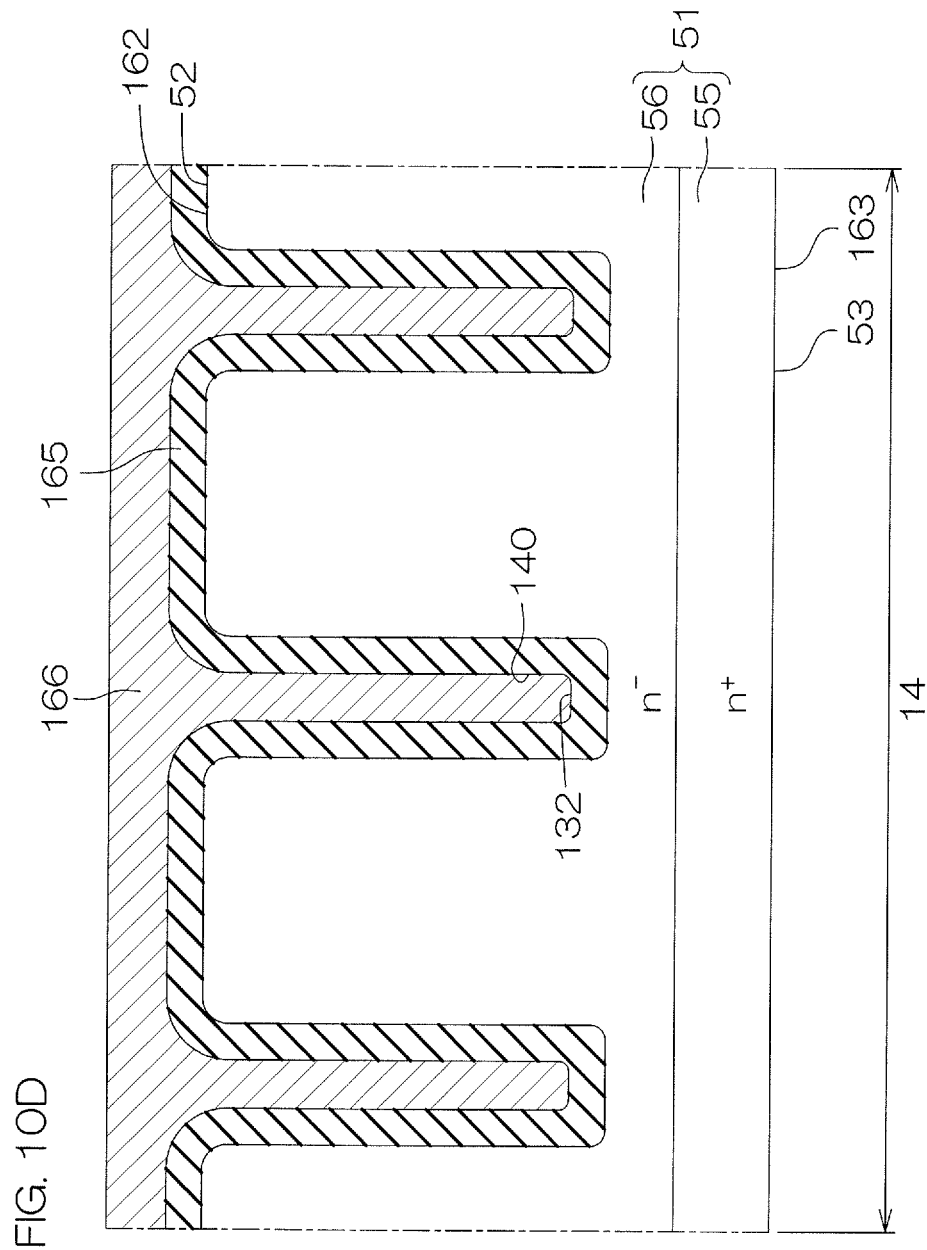

Thereafter, with reference to FIG. 9D and FIG. 10D, a first polysilicon layer 166 is formed on the first main surface 162. The first trench 71, the second trench 101, and the gate trench 132 are filled with the first polysilicon layer 166, thus covering the first main surface 162. The first polysilicon layer 166 may be formed by the CVD method.

Thereafter, an n-type impurity (for example, phosphorus) is added to the first polysilicon layer 166. This step may be omitted if doped polysilicon to which an n-type impurity has been already added is used as a material of the first polysilicon layer 166.

Figure 9E:
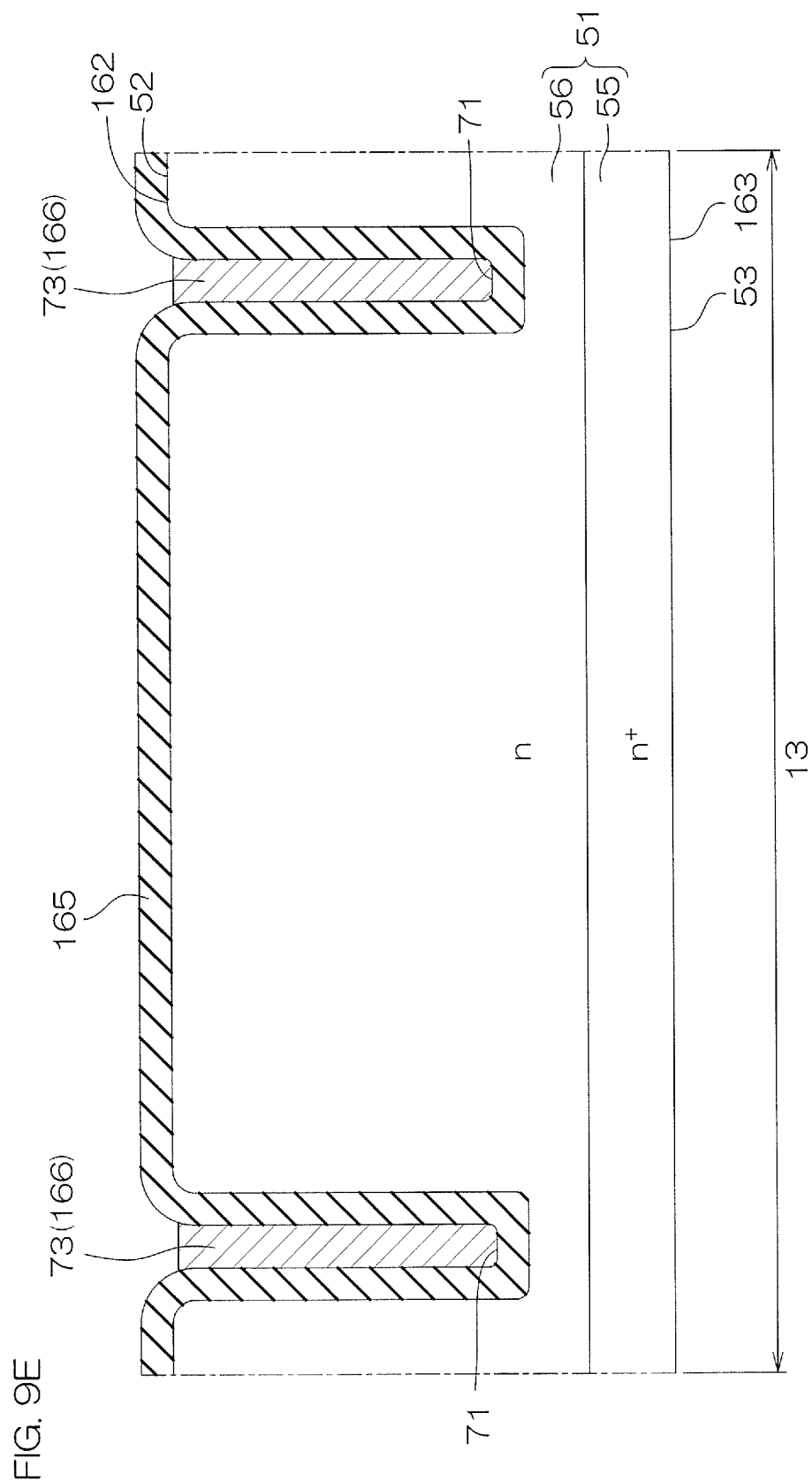
Figure 10E:
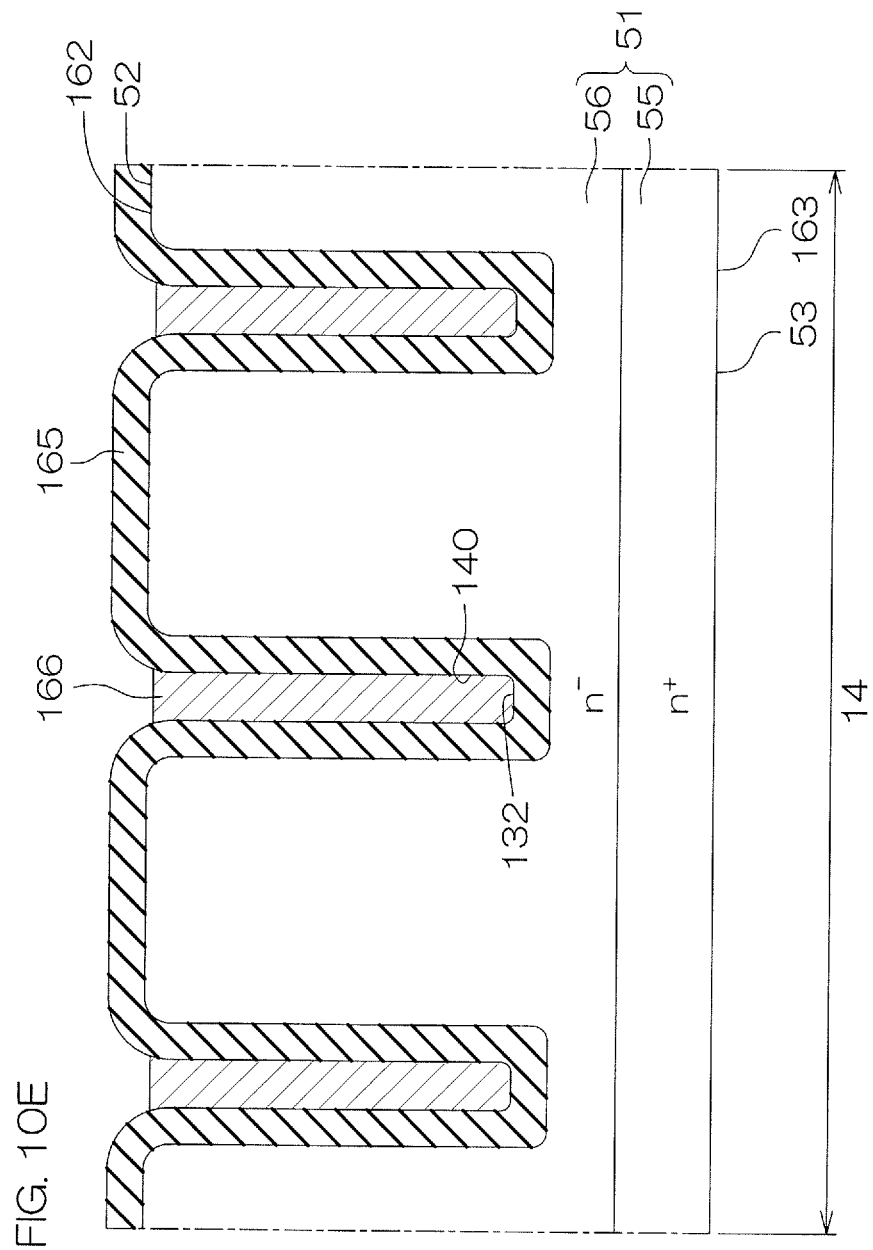

Thereafter, with reference to FIG. 9E and FIG. 10E, a needless part of the first polysilicon layer 166 is removed. The first polysilicon layer 166 may be removed by an etching method (an etch-back method). The etching method may be a wet etching method. The first polysilicon layer 166 is removed until the main surface of the insulation layer 165 is exposed. Hence, the first buried layer 73 and the second buried layer 103 are formed in the input region 13.

Figure 9F:
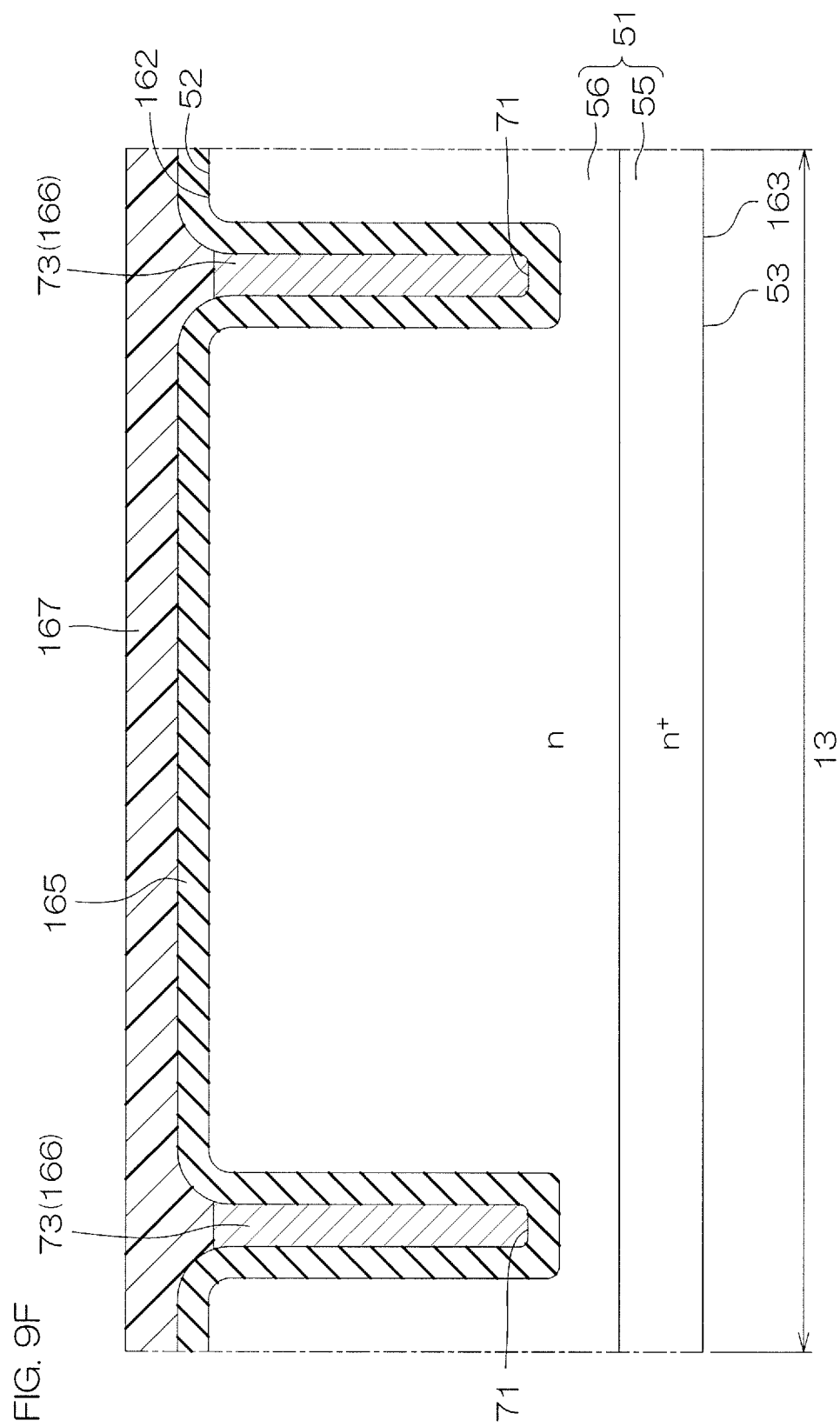

Thereafter, with reference to FIG. 9F and FIG. 10F, a second mask 167 that has a predetermined pattern is formed on the first main surface 162. The second mask 167 exposes the output region 14, and covers the input region 13.

Thereafter, a needless part of the first polysilicon layer 166 is removed. In this step, a part of the first polysilicon layer 166 that is positioned in the output region 14 is removed by the etching method through the second mask 167. The etching method may be the wet etching method.

The first polysilicon layer 166 is removed until an etching surface reaches a halfway portion in the depth direction of the gate trench 132. Hence, the lower gate electrode layer 135 is formed in the gate trench 132. Thereafter, the second mask 167 is removed.

Figure 9G:
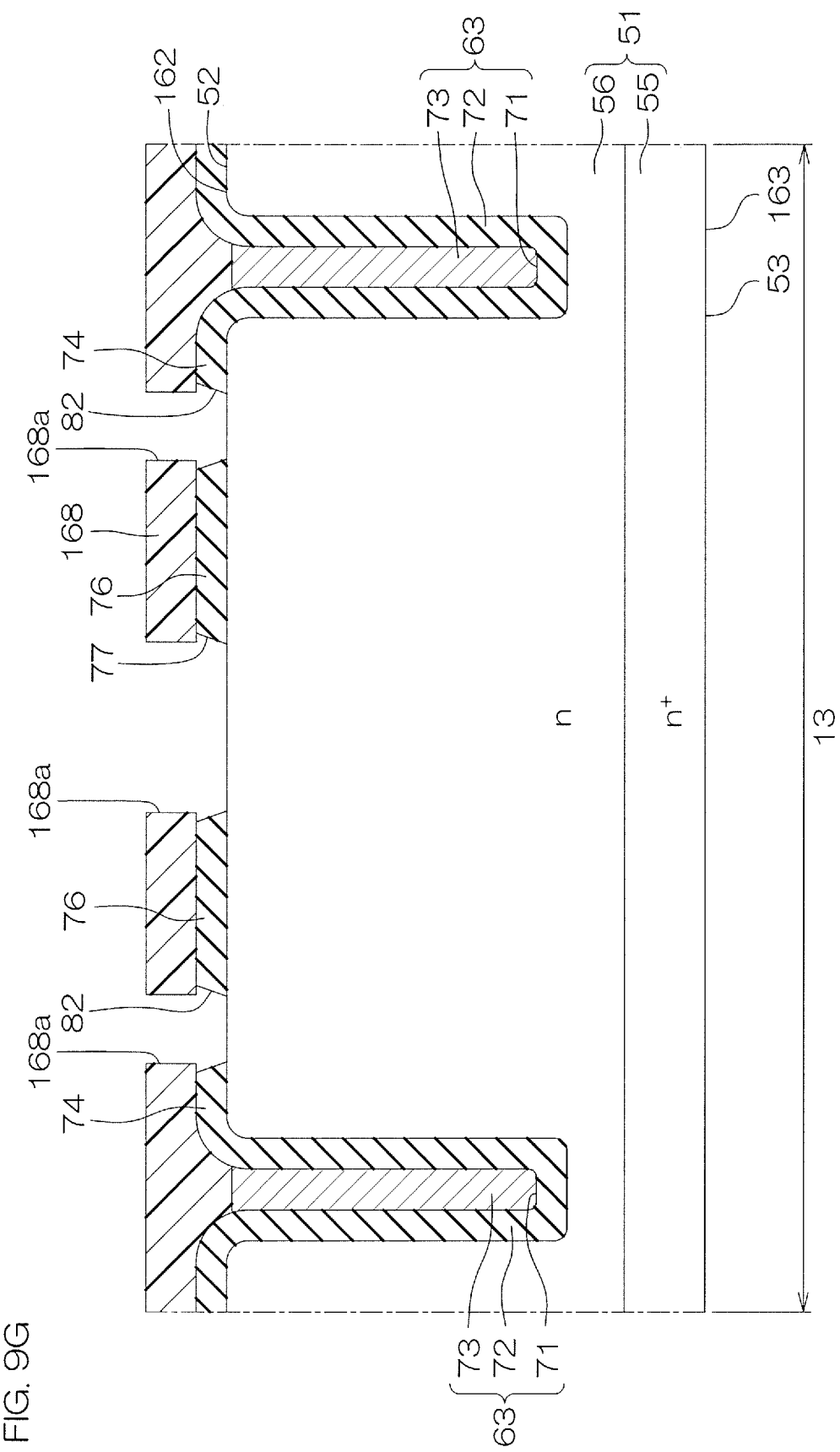
Figure 10G:
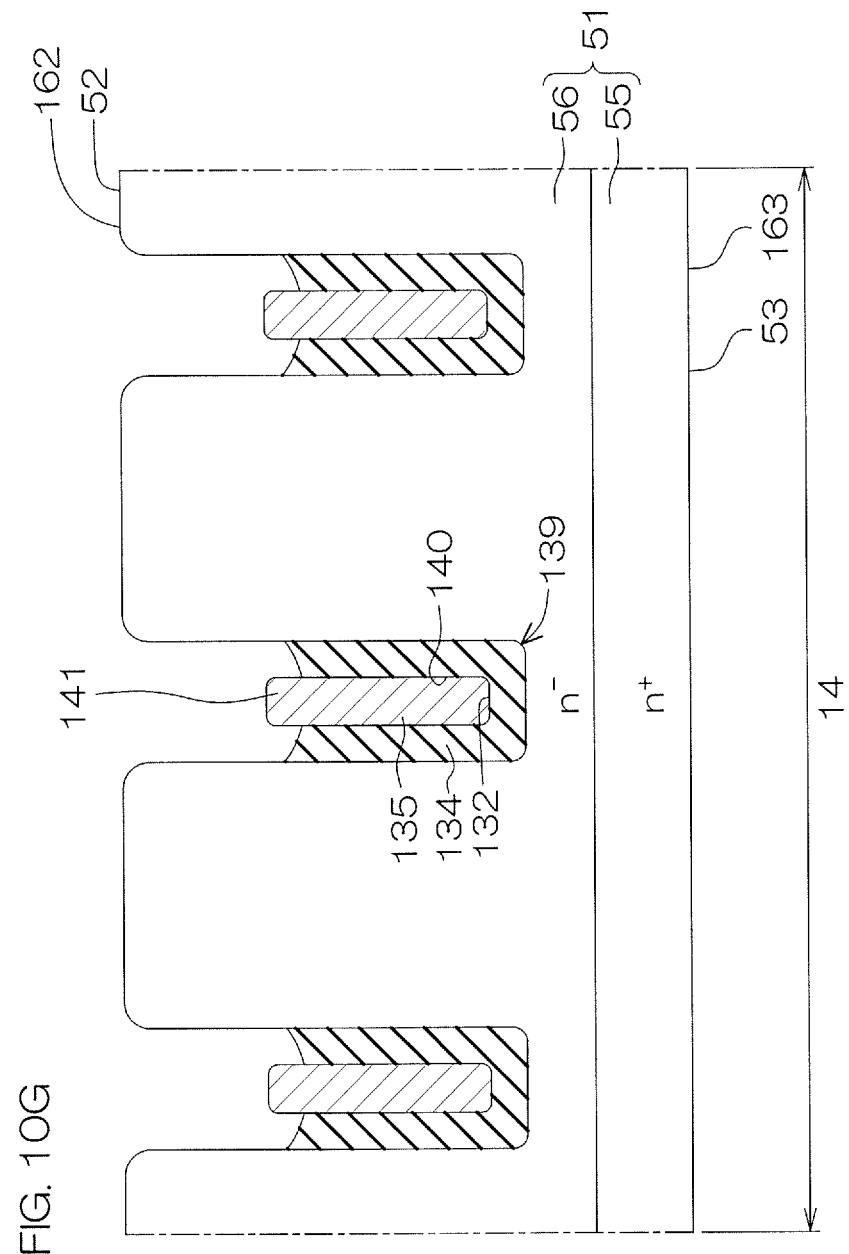

Thereafter, with reference to FIG. 9G and FIG. 10G, a third mask 168 that has a predetermined pattern is formed on the first main surface 162. The third mask 168 exposes the output region 14, and covers the input region 13.

In the input region 13, the third mask 168 has a plurality of openings 168a that expose regions in which the first contact opening 82, the second contact opening 112, the first opening 77, and the second opening 107 are respectively to be formed.

Thereafter, a part of the insulation layer 165 that is exposed from the third mask 168 is removed by the etching method through the third mask 168. The etching method may be the wet etching method.

Hence, the first trench insulation layer 72, the first field insulation layer 76, the first bridge insulation layer 79, the second trench insulation layer 102, the second field insulation layer 106, and the second bridge insulation layer 109 are formed in the input region 13.

The insulation layer 165 is removed until the upper end portion of the lower gate electrode layer 135 is exposed in the output region 14. Hence, the lower gate electrode layer 135 is formed. The lower gate electrode layer 135 has the projection portion 141 that protrudes upwardly beyond the upper end of the lower gate insulation layer 134.

Figure 9H:
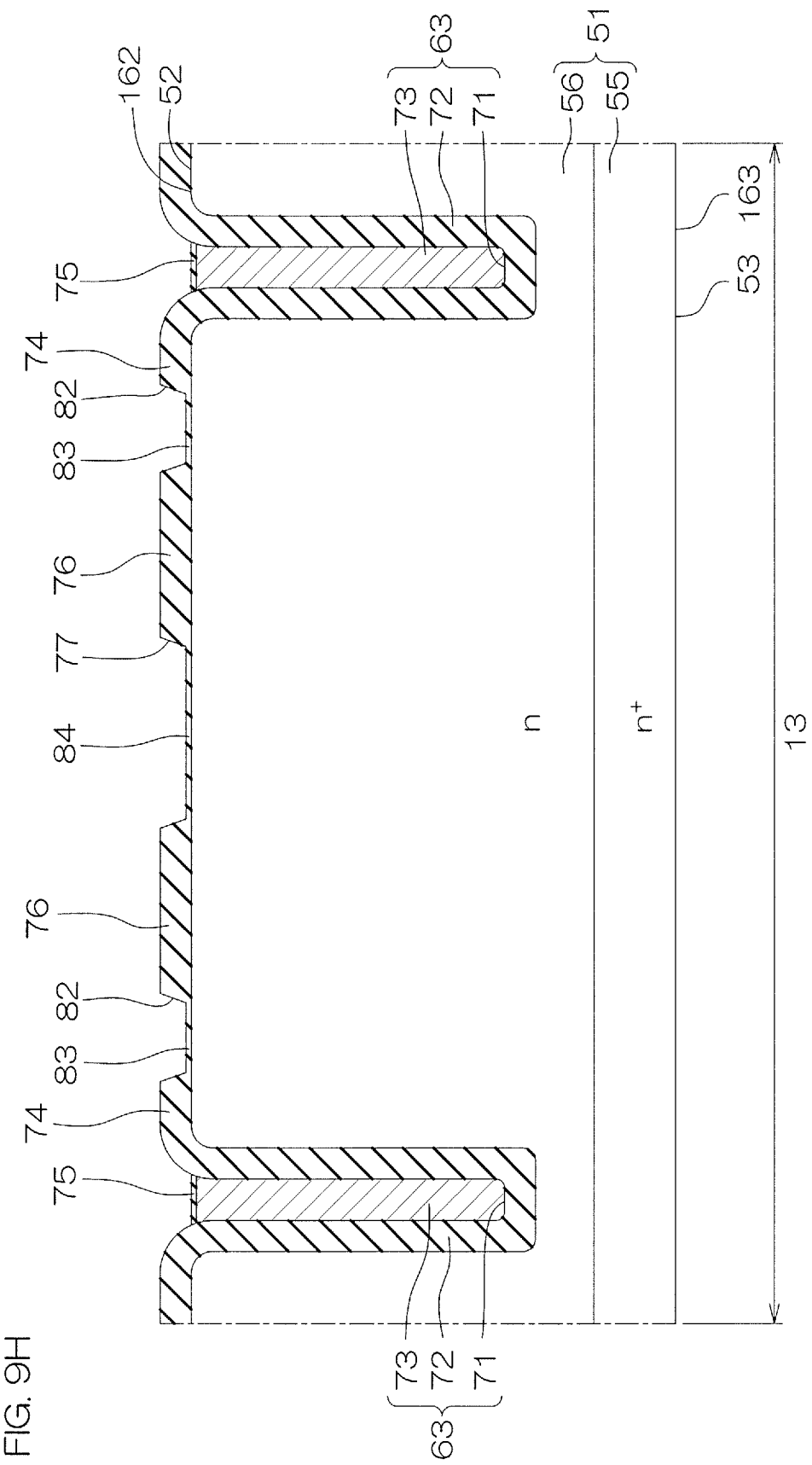
Figure 9:
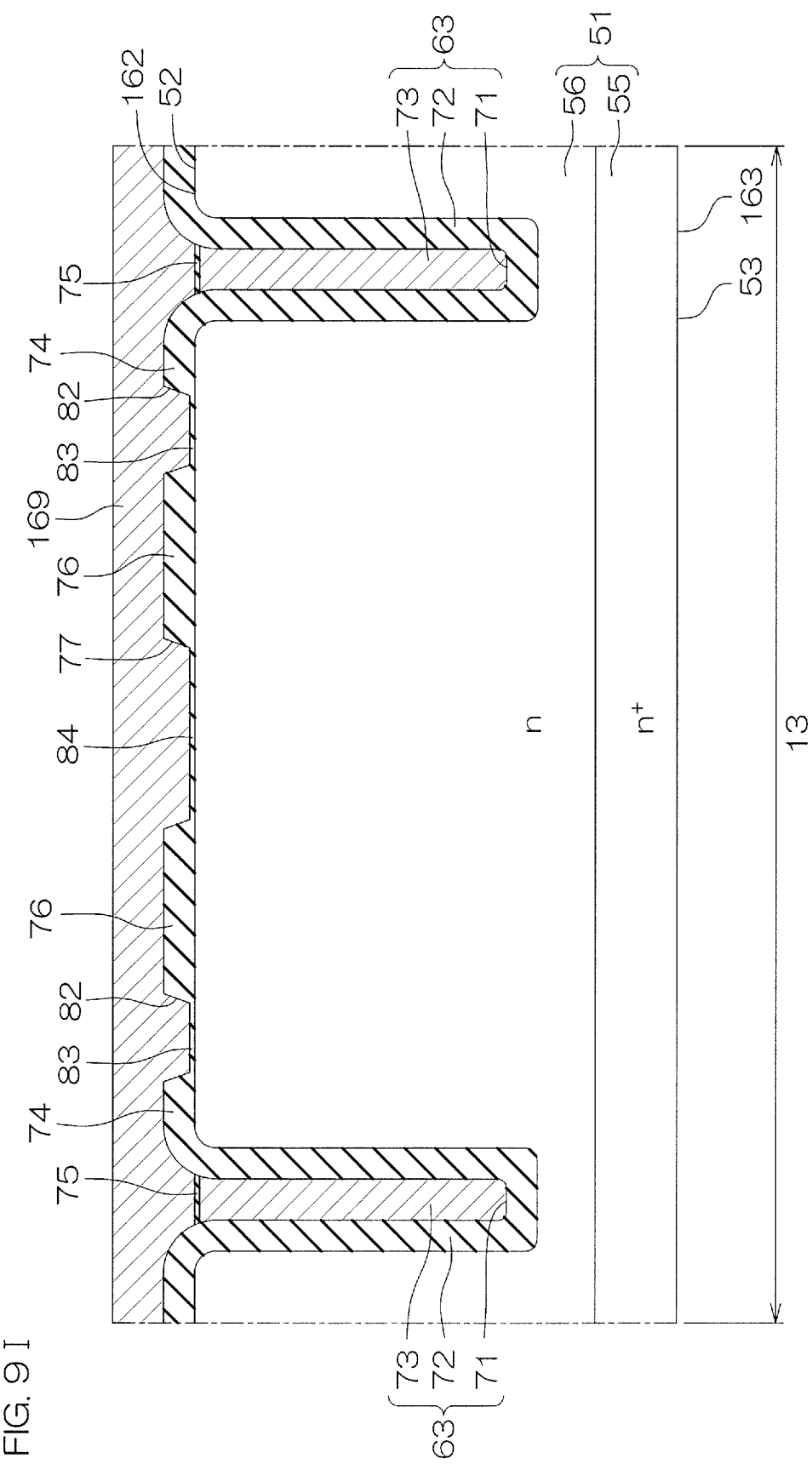
Figure 10H:
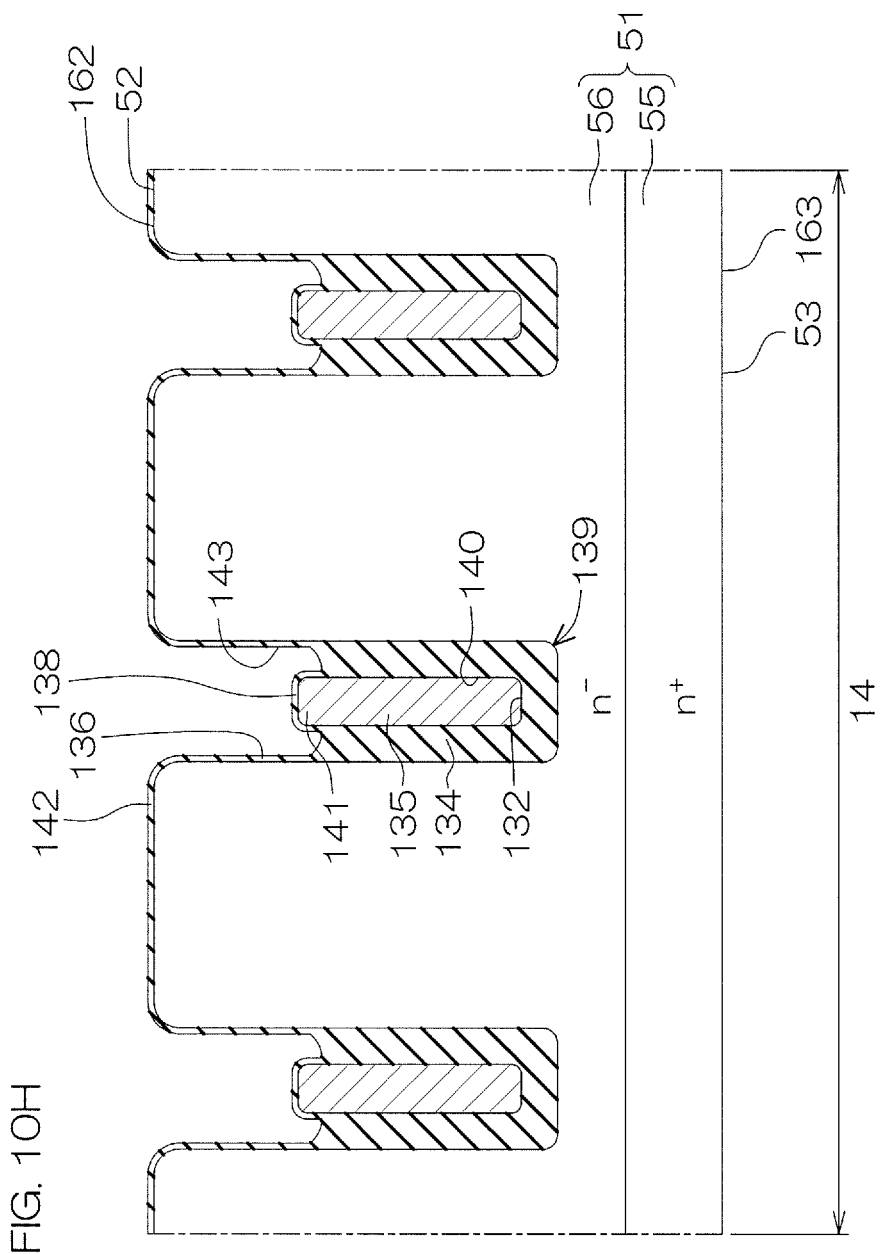

Thereafter, with reference to FIG. 9H and FIG. 10H, the first cap insulation layer 75, the second cap insulation layer 105, the first contact insulation layer 83, the second contact insulation layer 113, the first gate insulation layer 84, and the second gate insulation layer 114 are formed in the input region 13. Additionally, the intermediate insulation layer 138, the upper gate insulation layer 136, and the main surface insulation layer 142 are formed in the output region 14.

These insulation layers may be simultaneously formed by the shared oxidation treatment method (for example, the thermal oxidation treatment method). Additionally, apart or all of these insulation layers may be formed by different oxidation treatment methods at different timings. These insulation layers may be simultaneously formed by the CVD method.

Figure 10I:
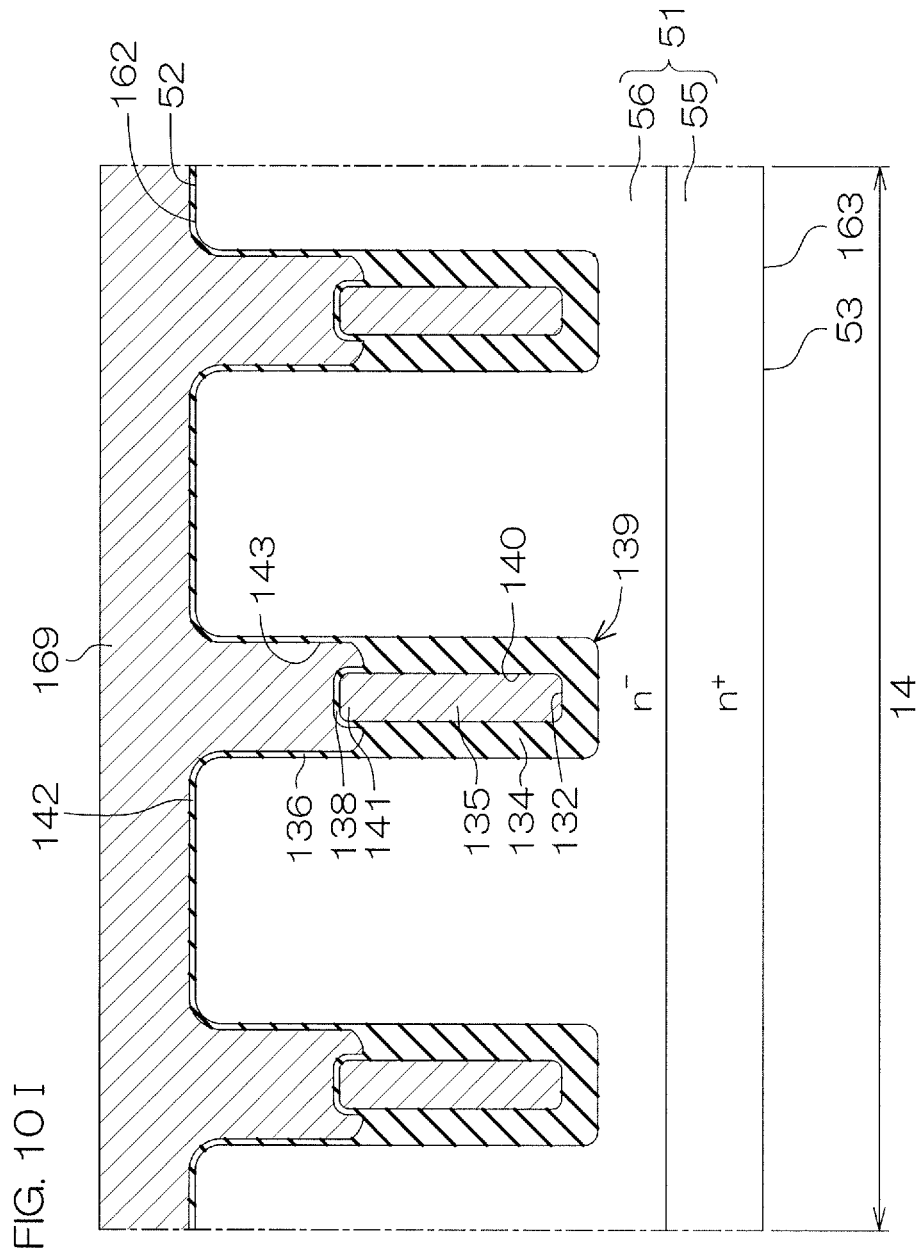

Thereafter, with reference to FIG. 9I and FIG. 10I, a second polysilicon layer 169 is formed on the first main surface 162. The first trench 71, the second trench 101, and the gate trench 132 are filled with the second polysilicon layer 169, thus covering the first main surface 162. The second polysilicon layer 169 may be formed by the CVD method.

Thereafter, an n-type impurity (for example, phosphorus) is added to the second polysilicon layer 169. This step may be omitted if doped polysilicon to which an n-type impurity has been already added is used as a material of the second polysilicon layer 169.

Figure 9J:
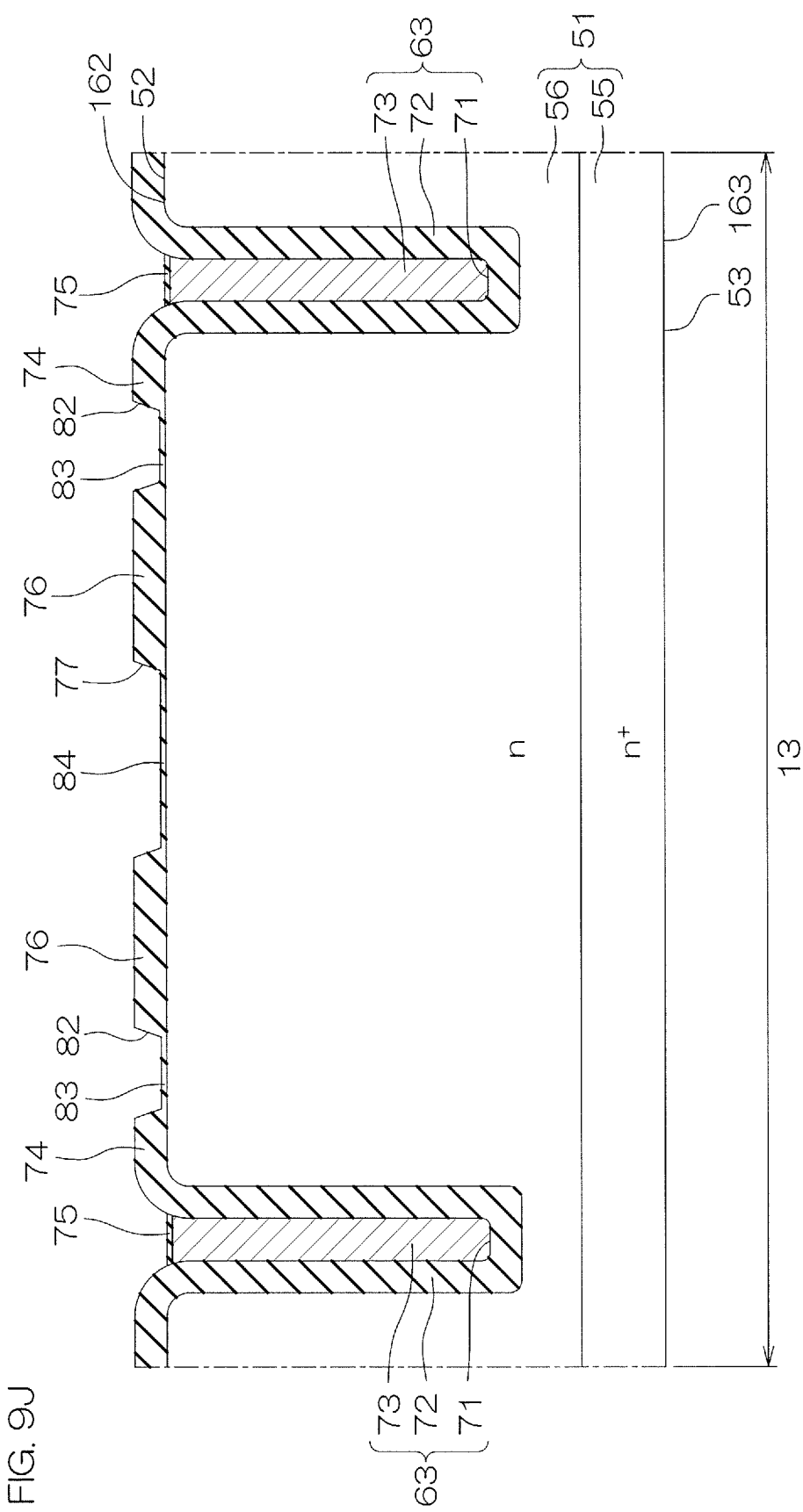
Figure 10J:
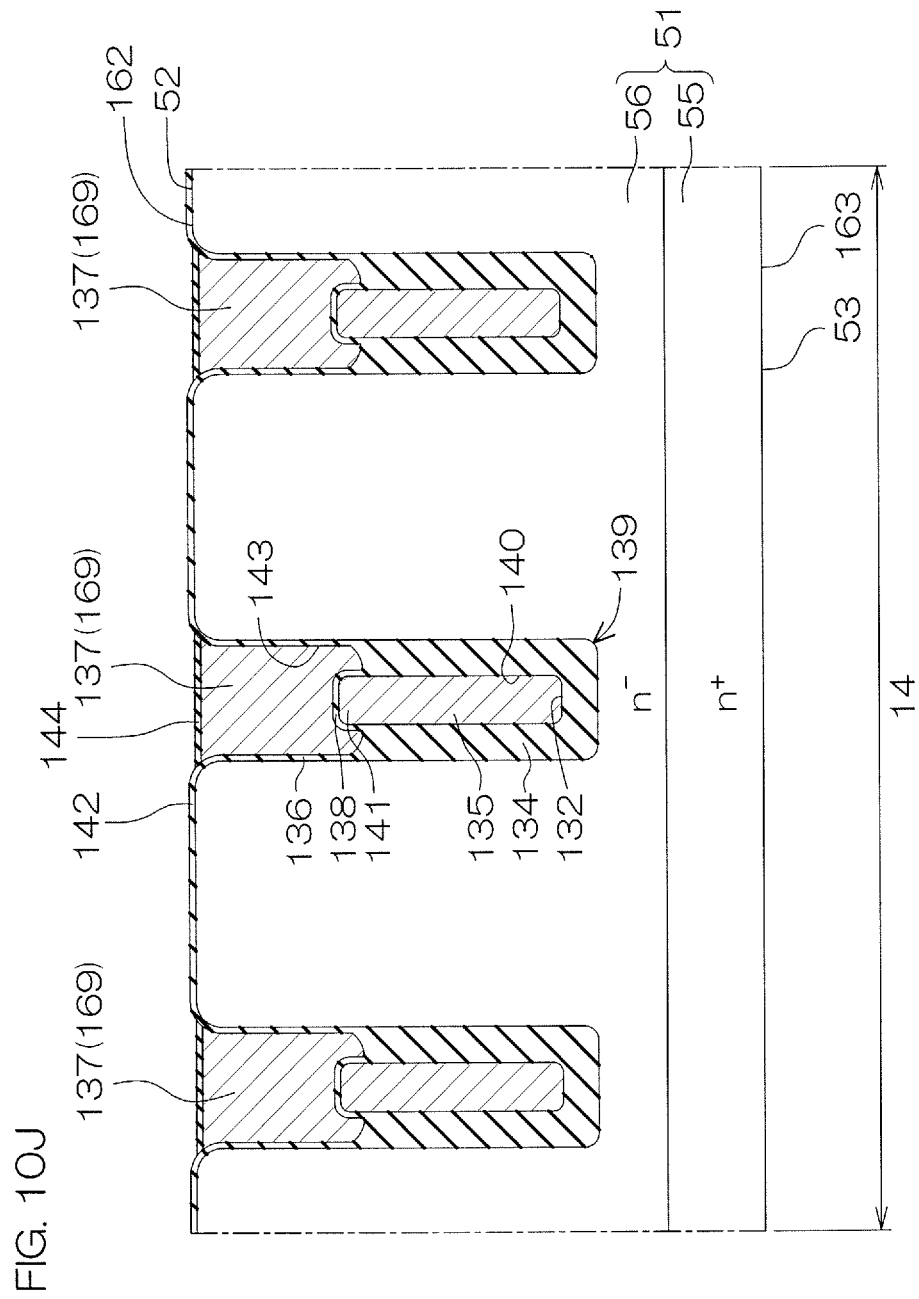

Thereafter, with reference to FIG. 9J and FIG. 10J, a needless part of the second polysilicon layer 169 is removed. The second polysilicon layer 169 may be removed by the etching method (the etch-back method). The etching method may be the wet etching method.

The second polysilicon layer 169 is removed until the main surface insulation layer 142 is exposed. The second polysilicon layer 169 may be removed until the etching surface is positioned below the first main surface 162. Hence, the upper gate electrode layer 137 is formed in the input region 13.

Thereafter, the third cap insulation layer 144 is formed on the exposed surface of the upper gate electrode layer 137. The third cap insulation layer 144 may be a natural oxide film, or may be formed by oxidation treatment.

Thereafter, the well region 85, the contact region 87, the source region 88, the drain region 89, the well region 115, the surface-layer well region 116, the contact region 117, the source region 118, and the drain region 119 are formed in the input region 13. These regions are formed by selectively introducing an n-type impurity and a p-type impurity into the surface layer portion of the first main surface 162 in the input region 13 according to an ion implantation method through an ion implantation mask.

Additionally, the body region 145, the source region 146, and the contact region 147 are formed in the output region 14. These regions are formed by selectively introducing an n-type impurity and a p-type impurity into the surface layer portion of the first main surface 162 in the output region 14 according to the ion implantation method through the ion implantation mask.

Thereafter, the interlayer insulation layer 95 is formed on the first main surface 162. Thereafter, the first gate electrode 90, the first contact electrode 91, the first source electrode 92, the first drain electrode 93, the second gate electrode 120, the second contact electrode 121, the second source electrode 122, the second drain electrode 123, the source pad electrode 150, etc., are buried in the interlayer insulation layer 95. Thereafter, the main surface of the interlayer insulation layer 95 is ground. The main surface of the interlayer insulation layer 95 may be ground by the CMP method.

The semiconductor device 1 is manufactured through a process including the aforementioned steps. In the method for manufacturing the semiconductor device 1, it is possible to simultaneously make the structure on the output-region-14 side and the structure on the input-region-13 side through the shared steps.

Figure 11:
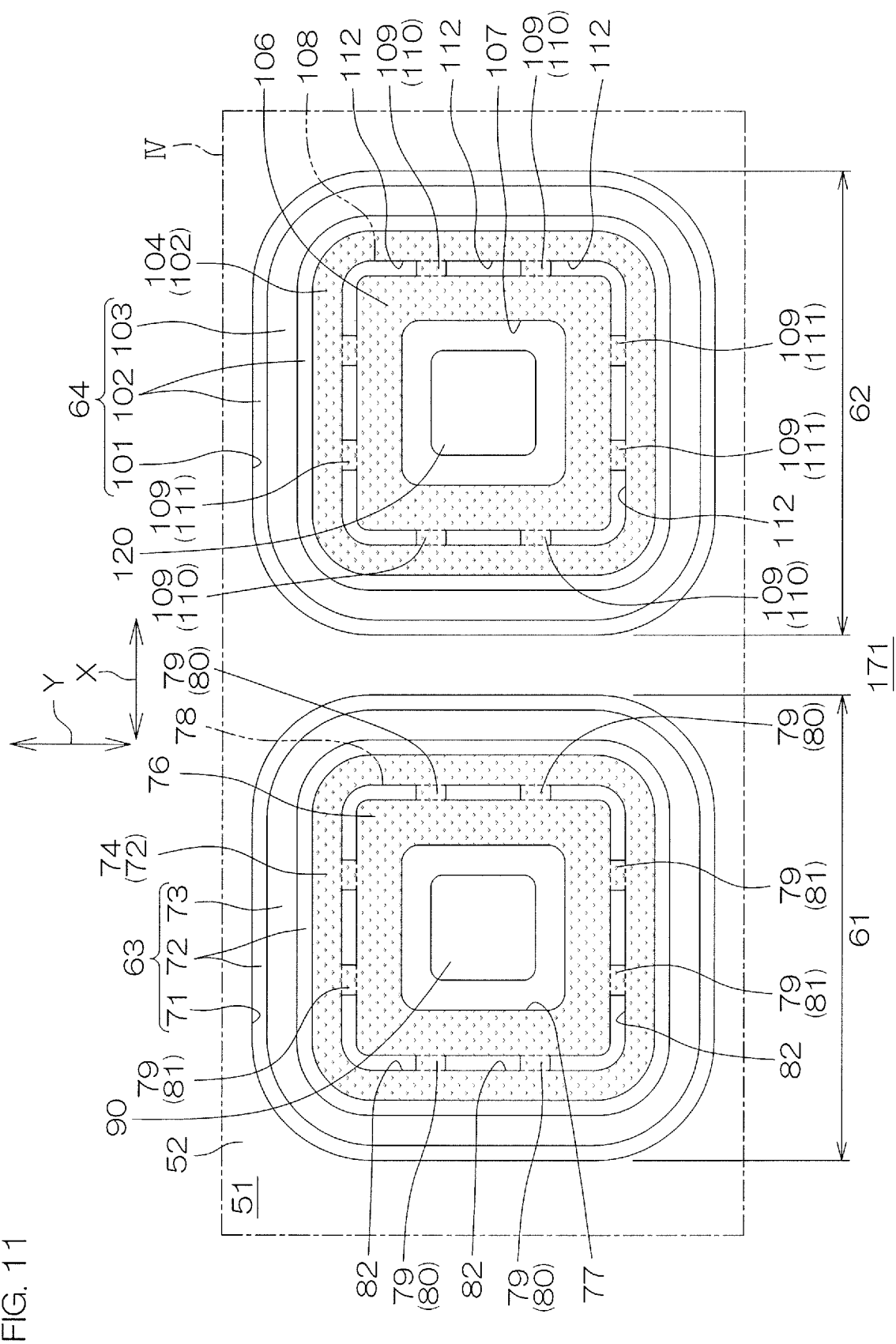
FIG. 11 is a plan view of a part corresponding to FIG. 4, and shows a semiconductor device according to a second preferred embodiment of the present invention.

FIG. 11 is a plan view of a part corresponding to FIG. 4, and shows a semiconductor device 171 according to a second preferred embodiment of the present invention. Hereinafter, the same reference sign is given to a structure corresponding to the structure of the semiconductor device 1, and a description thereof is omitted.

In the semiconductor device 171, the shape of the first contact opening 82 and the shape of the second contact opening 112 differ from the shape of the first contact opening 82 and the shape of the second contact opening 112 of the semiconductor device 1, respectively.

More specifically, in the n-type MIS region 61, the first bridge insulation layer 79 includes two pairs of first connection parts 80 that extend in a belt shape from the first trench insulation layer 72 toward the first field insulation layer 76 in the present preferred embodiment. Additionally, the first bridge insulation layer 79 includes two pairs of second connection parts 81 that extend in a belt shape from the first trench insulation layer 72 toward the first field insulation layer 76 in the present preferred embodiment. In the first intermediate region 78, a plurality of (in the present preferred embodiment, eight) first contact openings 82 that extend in an end-having belt shape are defined.

In the p-type MIS region 62, the second bridge insulation layer 109 includes two pairs of first connection parts 110 that extend in a belt shape toward the second trench insulation layer 102 and the second field insulation layer 106 in the present preferred embodiment. Additionally, in the present preferred embodiment, the second bridge insulation layer 109 includes two pairs of second connection parts 111 that extend in a belt shape toward the second trench insulation layer 102 and the second field insulation layer 106. In the second intermediate region 108, a plurality of (in the present preferred embodiment, eight) second contact openings 112 that extend in an end-having belt shape are defined.

The plurality of contact regions 87 may be formed in shapes corresponding to the shapes of the first contact openings 82, respectively (not shown). The plurality of contact regions 87 may be formed in end-having belt shapes that extend along the first intermediate region 78, respectively.

Additionally, the plurality of contact regions 117 may be formed in shapes corresponding to the shapes of the second contact openings 112, respectively. The plurality of contact regions 117 may be formed in end-having belt shapes that extend along the second intermediate region 108, respectively.

As described above, the same effect as the effect described with respect to the semiconductor device 1 can also be fulfilled by the semiconductor device 171.

Figure 12:
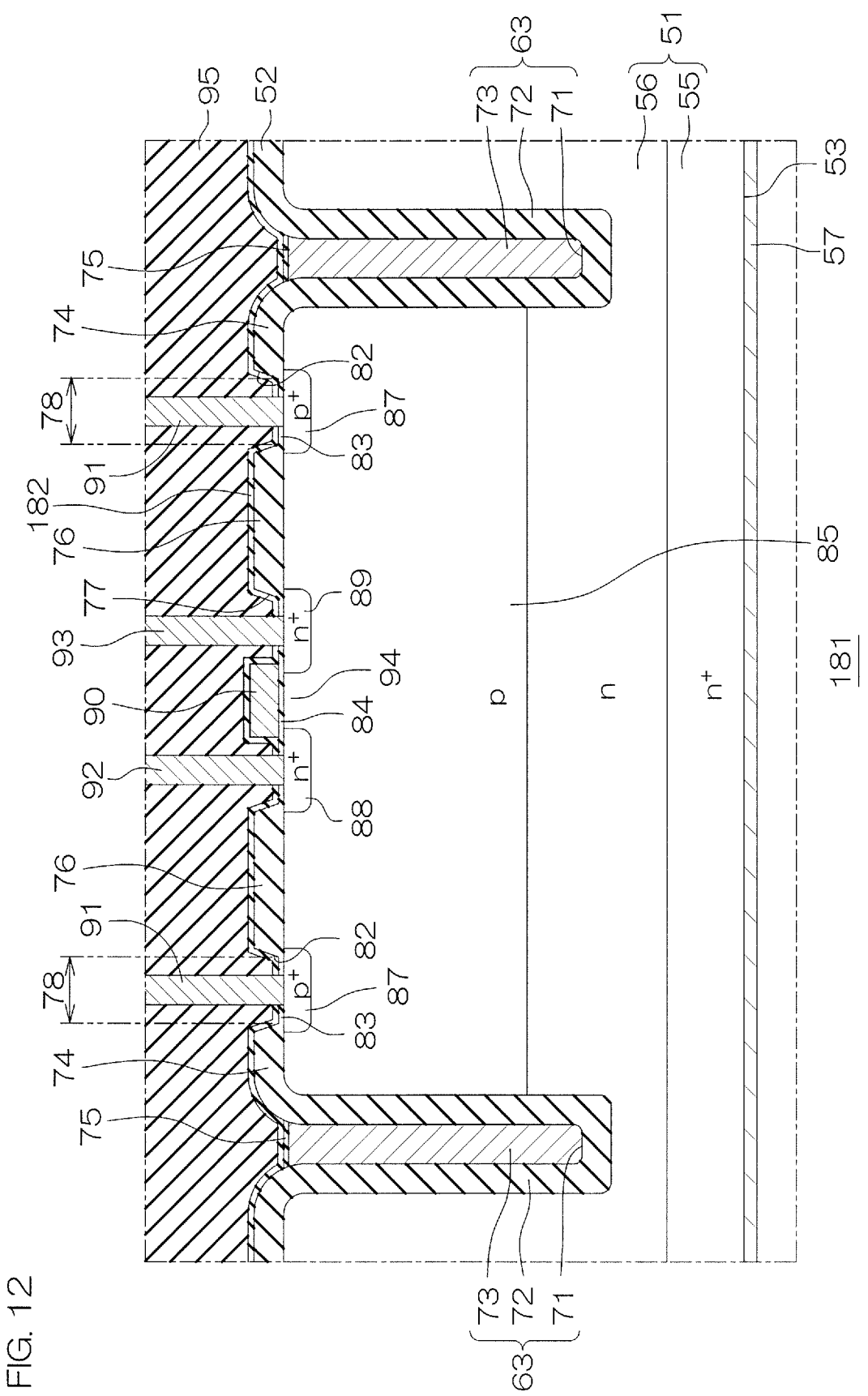
FIG. 12 is a cross-sectional view of a part corresponding to FIG. 5, and shows a semiconductor device according to a third preferred embodiment of the present invention.

FIG. 12 is a cross-sectional view of a part corresponding to FIG. 5, and shows a semiconductor device 181 according to a third preferred embodiment of the present invention. Hereinafter, the same reference sign is given to a structure corresponding to the structure of the semiconductor device 1, and a description thereof is omitted.

The semiconductor device 181 further includes an insulation layer 182 that is interposed in a region between the first main surface 52 of the semiconductor layer 51 and the interlayer insulation layer 95. The insulation layer 182 is also formed in the output region 14 and in the input region 13 (not shown).

The insulation layer 182 covers the first trench insulation layer 72, the first field insulation layer 76, and the first bridge insulation layer 79. The insulation layer 182 is made of an insulating material differing from that of the interlayer insulation layer 95. Additionally, the insulation layer 182 is made of an insulating material differing from that of the first trench insulation layer 72, from that of the first field insulation layer 76, and from that of the first bridge insulation layer 79.

In the present preferred embodiment, the insulation layer 182 includes silicon nitride. In the present preferred embodiment, the first trench insulation layer 72, the first field insulation layer 76, the first bridge insulation layer 79, and the interlayer insulation layer 95 include silicon oxide.

The first contact electrode 91 passes through the insulation layer 182 and through the first contact insulation layer 83 and is electrically connected to the contact region 87. The first source electrode 92 passes through the insulation layer 182 and through the first gate insulation layer 84 and is electrically connected to the source region 88. The first drain electrode 93 passes through the insulation layer 182 and through the first gate insulation layer 84 and is electrically connected to the drain region 89.

The insulation layer 182 is also formed in the p-type MIS region 62. A structure on the p-type-MIS-region-62 side is substantially identical with the structure on the n-type-MIS-region-61 side, and therefore a description thereof is omitted.

As described above, the same effect as the effect described with respect to the semiconductor device 1 can also be fulfilled by the semiconductor device 181.

Although the preferred embodiments of the present invention have been described, the present invention can be embodied in other modes.

Figure 13:
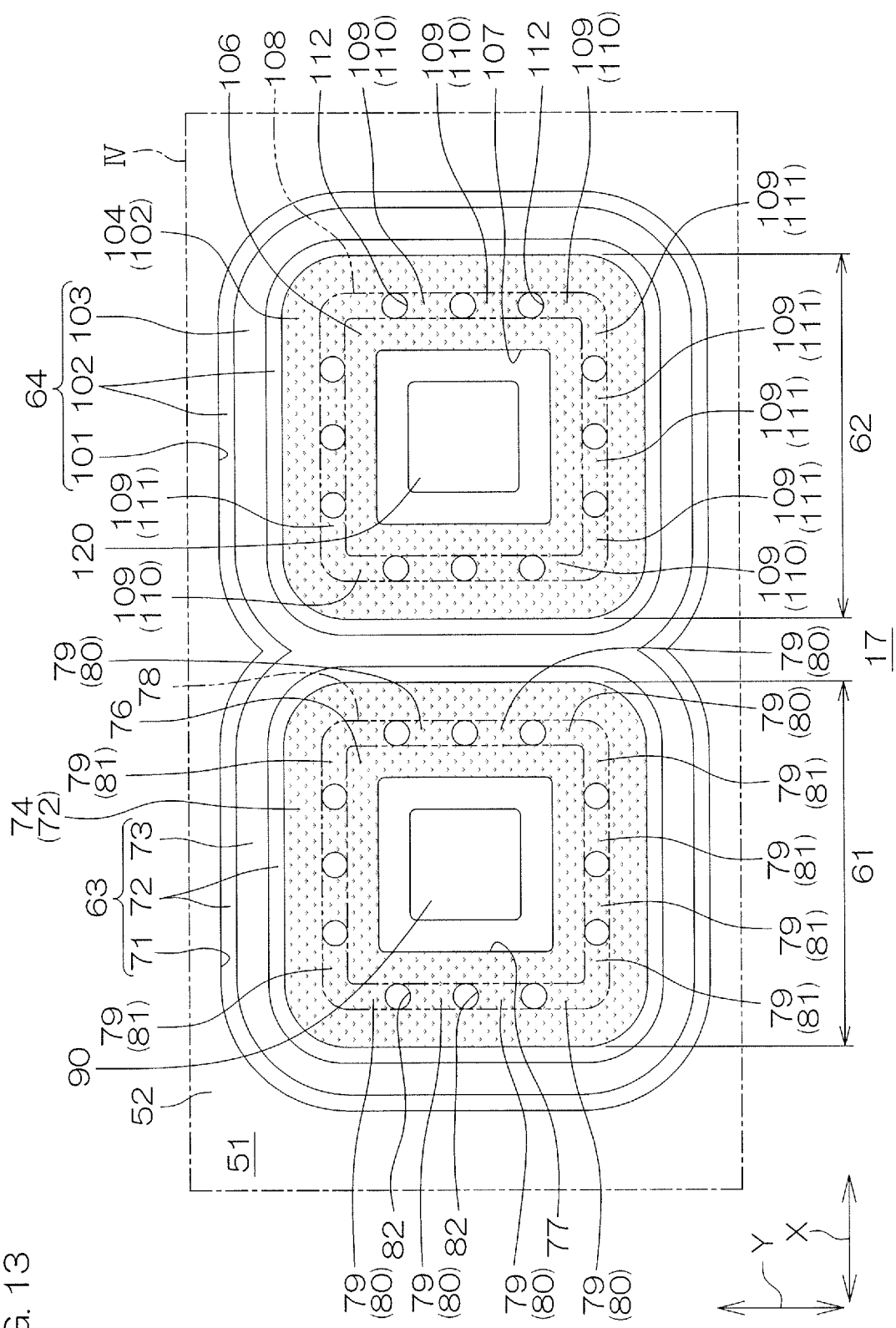
FIG. 13 is a plan view of a part corresponding to FIG. 4, and shows a modification of a first element isolation structure and a second element isolation structure.

FIG. 13 is a plan view of a part corresponding to FIG. 4, and shows a modification of the first device isolation structure 63 and the second device isolation structure 64. Hereinafter, the same reference sign is given to a structure corresponding to the structure of the semiconductor device 1, and a description thereof is omitted.

As described in the semiconductor device 1, the second device isolation structure 64 is formed away from the first device isolation structure 63. On the other hand, in the present preferred embodiment, the second device isolation structure 64 is formed integrally with the first device isolation structure 63.

In other words, the second trench 101 is formed integrally with the first trench 71. The second trench insulation layer 102 is formed integrally with the first trench insulation layer 72 in a trench connection region 183. The first buried layer 73 and the second buried layer 103 are formed integrally with each other in the trench connection region 183. The trench connection region 183 is a region to which the first trench 71 and the second trench 101 are connected.

Likewise, the thus formed structure makes it possible to fulfill the same effect as the effect described with respect to the semiconductor device 1. The structure in which the second device isolation structure 64 is formed integrally with the first device isolation structure 63 may be applied to the second preferred embodiment and to the third preferred embodiment, in addition to the first preferred embodiment.

In each of the aforementioned preferred embodiments, a structure in which the conductivity type of each semiconductor part is reversed may be employed. In other words, the p-type part may be allowed to be an n-type, and the n-type part may be allowed to be a p-type.

In each of the aforementioned preferred embodiments, the semiconductor layer 51 may include a monolayer structure that includes an n-type silicon-made FZ substrate (a semiconductor substrate) formed by an FZ (Floating Zone) method. In this case, an $n^+$ type impurity region (drain region) corresponding to the $n^+$ type semiconductor substrate 55 is formed by implanting an n-type impurity into the second main surface 53 of the semiconductor layer 51. In this case, n-type regions except the $n^+$ type impurity region (drain region) become n-type impurity regions each of which corresponds to the n-type epitaxial layer 56 (drift region) in the semiconductor layer 51.

In each of the aforementioned preferred embodiments, the first trench 71 may have the area of its opening formed to be larger than the area of its bottom wall and formed to be tapered in a cross-sectional view. In the semiconductor layer 51, the absolute value of an angle θ between the first main surface 52 and the sidewall of the first trench 71 may be not less than 90° and not more than 95° (for example, about 91°).

In each of the aforementioned preferred embodiments, the second trench 101 may have the area of its opening formed to be larger than the area of its bottom wall and formed to be tapered in a cross-sectional view. In the semiconductor layer 51, the absolute value of an angle θ between the first main surface 52 and the sidewall of the second trench 101 may be not less than 90° and not more than 95° (for example, about 91°).

In each of the aforementioned preferred embodiments, the gate trench 132 may have the area of its opening formed to be larger than the area of its bottom wall and formed to be tapered in a cross-sectional view. In the semiconductor layer 51, the absolute value of an angle θ between the first main surface 52 and the sidewall of the gate trench 132 may be not less than 90° and not more than 95° (for example, about 91°).

In each of the aforementioned preferred embodiments, the package type employed in the semiconductor devices 1, 171, and 181 is not limited to a TO-based package typified by, for example, TO-220 or TO-252.

SOP (Small Outline Package), QFN (Quad For Non Lead Package), DFP (Dual Flat Package), DIP (Dual Inline Package), QFP (Quad Flat Package), SIP (Single Inline Package), or SOJ (Small Outline J-leaded Package) is employed as the package type of the semiconductor devices 1, 171, and 181, or various package types similar to these package types are employed. A description will be hereinafter given of a mode example in which SOP is employed in the semiconductor device 1.

Figure 14:
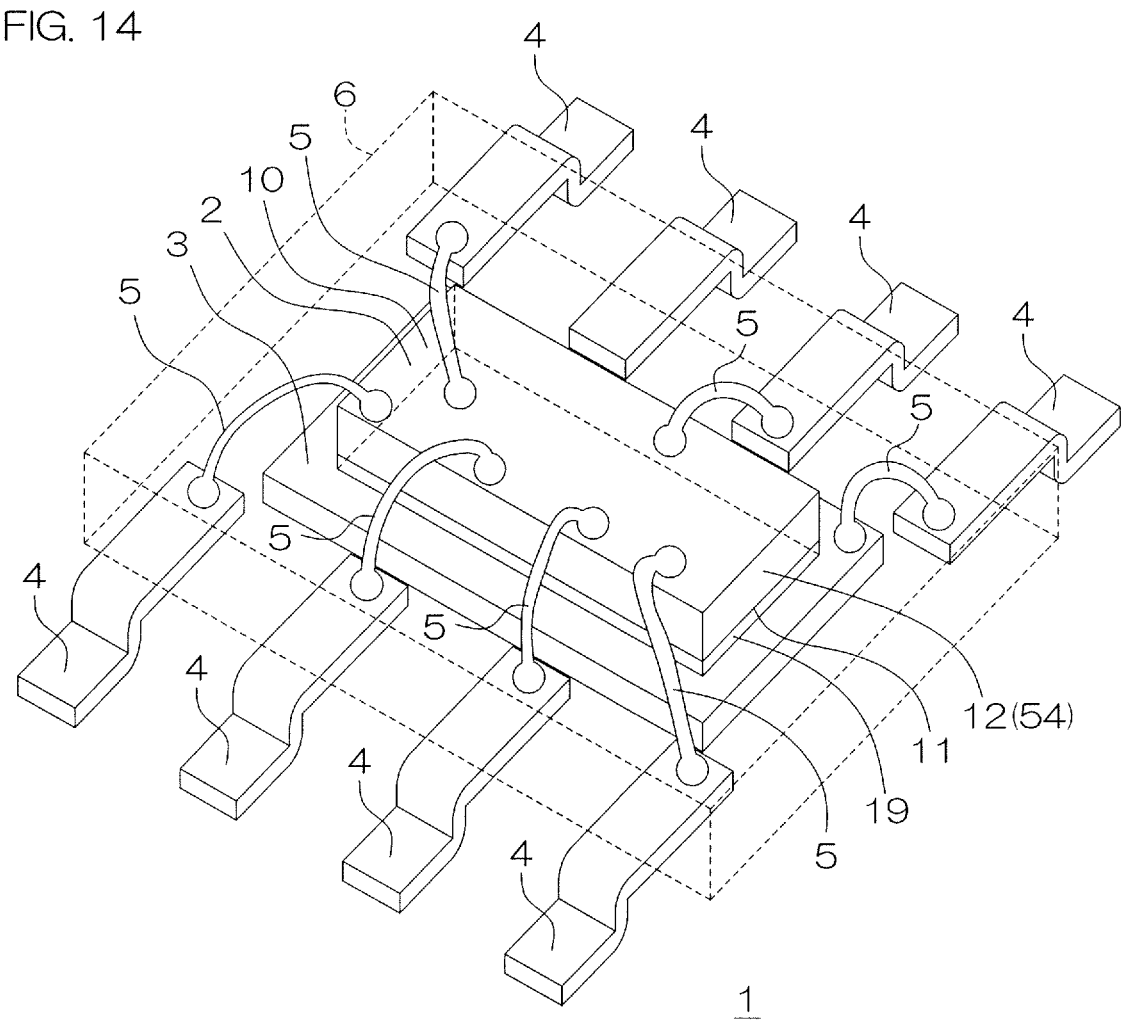
FIG. 14 is a perspective view showing a mode example in which a different package type is employed in the semiconductor device of FIG. 1, seen through a semiconductor package.
Figure 15:
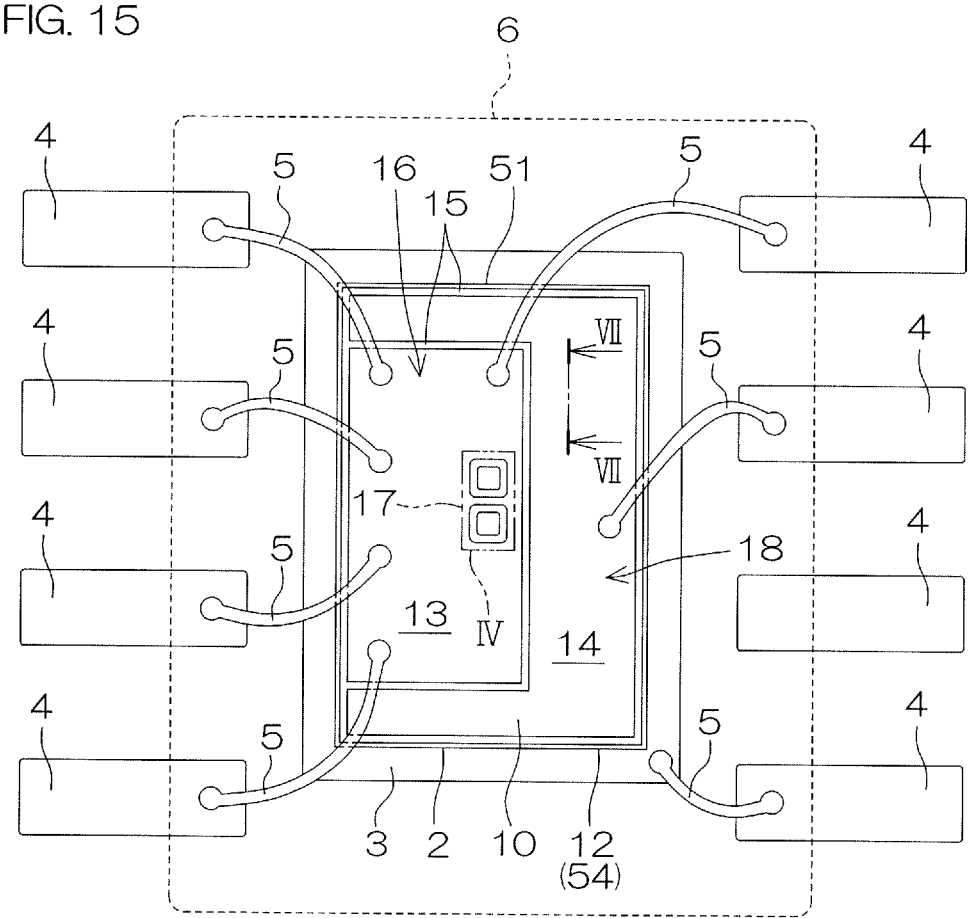
FIG. 15 is a plan view showing an internal structure of the semiconductor device of FIG. 14.

FIG. 14 is a perspective view showing a mode example in which a different package type is employed in the semiconductor device 1 of FIG. 1, seen through the semiconductor package 6. FIG. 15 is a plan view showing an internal structure of the semiconductor device 1 of FIG. 14. Hereinafter, the same reference sign is given to a structure corresponding to the structure of the semiconductor device 1, and a description thereof is omitted.

With reference to FIG. 14 and FIG. 15, the semiconductor device 1 is an electronic component in which SOP is employed as a package type in this example. The semiconductor device 1 includes the IPD chip 2, the die pad 3, the plurality of lead terminals 4, the plurality of lead wires 5, and the semiconductor package 6.

The die pad 3 supports the IPD chip 2 from the second-chip-main surface-11 side. The die pad 3 is formed in a rectangular parallelepiped shape. The IPD chip 2 is connected to the die pad 3 through the conductive bonding material 19.

The plurality of lead terminals 4 are disposed around the die pad 3. Four lead terminals 4 among the plurality of lead terminals 4 are disposed away from each other along one side of the die pad 3. The remaining four lead terminals 4 are disposed away from each other along an opposite side that faces the one side of the die pad 3.

Some of the lead terminals 4 may be electrically connected to arbitrary regions of the IPD chip 2 through the lead wires 5. One of or some of the plurality of lead terminals 4 may be electrically connected to the die pad 3 through the lead wires 5.

The semiconductor package 6 is formed in a rectangular parallelepiped shape. The semiconductor package 6 seals the IPD chip 2, the die pad 3, and the plurality of lead terminals 4. The plurality of lead terminals 4 are each drawn outwardly from the inside of the semiconductor package 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
a semiconductor layer that has a main surface including a defined region defined by a trench;
a trench insulation layer formed in the trench;
a field insulation layer that covers the defined region away from the trench; and
a bridge insulation layer that is formed in a region between the trench and the field insulation layer in the defined region and that is connected to the trench insulation layer and to the field insulation layer,
wherein a plurality of contact openings, each of which exposes a surface of the semiconductor layer, is formed in the bridge insulation layer around the field insulation layer.

2. The semiconductor device according to claim 1, wherein the bridge insulation layer restrains a crystal defect from occurring in the semiconductor layer.

3. The semiconductor device according to claim 1, wherein the bridge insulation layer forms a single insulation layer that extends continuously together with the field insulation layer and with the trench insulation layer.

4. The semiconductor device according to claim 1, wherein the trench insulation layer includes an overlap portion that is drawn out from an inside of the trench onto the semiconductor layer and that covers the defined region, and
the field insulation layer is continuous with the overlap portion in the defined region.

5. The semiconductor device according to claim 1, wherein the bridge insulation layer includes a plurality of connection parts formed away from each other.

6. The semiconductor device according to claim 1, wherein the bridge insulation layer includes a pair of connection parts that sandwich both sides of the field insulation layer.

7. A semiconductor device comprising:
a semiconductor layer that has a main surface including a defined region defined by a trench;
a trench insulation layer formed in the trench;
a field insulation layer that covers the defined region away from the trench; and
a bridge insulation layer that is formed in a region between the trench and the field insulation layer in the defined region and that is connected to the trench insulation layer and to the field insulation layer,
wherein the bridge insulation layer includes a pair of first connection parts that sandwich both sides of the field insulation layer from a first direction and a pair of second connection parts that sandwich both sides of the field insulation layer from a second direction that intersects the first direction.

8. The semiconductor device according to claim 1, wherein an opening is formed in an inward portion of the field insulation layer.

9. A semiconductor device comprising:
a semiconductor layer that has a main surface including a defined region defined by a trench;
a trench insulation layer formed in the trench;
a field insulation layer that covers the defined region away from the trench; and
a bridge insulation layer that is formed in a region between the trench and the field insulation layer in the defined region and that is connected to the trench insulation layer and to the field insulation layer,
wherein an opening is formed in an inward portion of the field insulation layer,
wherein the defined region is an active region including a transistor of an insulated-gate type, and
a gate insulating layer of the transistor is formed in the opening of the field insulation layer.

10. The semiconductor device according to claim 1, wherein the trench insulation layer is formed in a film shape along an inwall of the trench.

11. The semiconductor device according to claim 10, further comprising a buried layer buried in the trench with the trench insulation layer between the buried layer and the trench.

12. The semiconductor device according to claim 11, wherein the buried layer includes polysilicon.

13. The semiconductor device according to claim 1, wherein the trench is annularly formed in a plan view.

14. A semiconductor device, comprising:
a semiconductor layer that has a main surface including a defined region defined by a trench;
a trench insulation layer formed in the trench;
a field insulation layer that covers the defined region away from the trench; and
a bridge insulation layer that is formed in a region between the trench and the field insulation layer in the defined region and that is connected to the trench insulation layer and to the field insulation layer;
a contact region formed in a region between the trench and the field insulation layer in a surface layer portion of the semiconductor layer; and
a contact electrode connected to the contact region in the main surface of the semiconductor layer.

15. The semiconductor device according to claim 14 further comprising a contact insulation layer that has a thickness not more than a thickness of the bridge insulation layer and that covers the contact region,
wherein the contact electrode passes through the contact insulation layer and is connected to the contact region.

16. The semiconductor device according to claim 15 further comprising an insulation layer that has a thickness not more than a thickness of the bridge insulation layer and that includes an insulating material differing from an insulating material of the bridge insulation layer and that covers the contact insulation layer,
wherein the contact electrode passes through the insulation layer and through the contact insulation layer.

17. The semiconductor device according to claim 16, wherein the insulation layer covers the bridge insulation layer.

* * * * *